US012658029B2

(12) United States Patent (10) Patent No.: US 12,658,029 B2
Karjalainen et al. (45) Date of Patent: Jun. 16, 2026

(54) SENSOR ARRAYS, METHODS, SYSTEMS AND DEVICES

(71) Applicant: METROCOUNT PTY LTD, North Coogee (AU)

(72) Inventors: Sami Karjalainen, North Coogee (AU); Thomas Kenny, North Coogee (AU)

(73) Assignee: METROCOUNT PTY LTD, North Coogee (AU)

( * ) Notice: Subject to any disclaimer, the term of this patent is extended or adjusted under 35 U.S.C. 154(b) by 0 days.

(21) Appl. No.: 18/686,763

(22) PCT Filed: Aug. 25, 2022

(86) PCT No.: PCT/AU2022/051053
§ 371 (c)(1),
(2) Date: Feb. 26, 2024

(87) PCT Pub. No.: WO2023/023825
PCT Pub. Date: Mar. 2, 2023

(65) Prior Publication Data
US 2024/0355195 A1 Oct. 24, 2024

(30) Foreign Application Priority Data

Aug. 25, 2021 (AU) ................................. 2021107499

(51) Int. Cl.
*G08G 1/01* (2006.01)
*E01F 9/512* (2016.01)
(Continued)

(52) U.S. Cl.
CPC ............ *G08G 1/0116* (2013.01); *E01F 9/512* (2016.02); *E01F 11/00* (2013.01); *G01H 11/08* (2013.01);
(Continued)

(58) Field of Classification Search
CPC .... G08G 1/0116; G08G 1/0125; G08G 1/042; E01F 9/512; E01F 11/00; G01H 11/08; G01R 33/02
See application file for complete search history.

(56) References Cited

U.S. PATENT DOCUMENTS 3,246,219 A 4/1966 Devol
3,458,802 A 7/1969 Koerner
(Continued)

FOREIGN PATENT DOCUMENTS

CN 111108536 A 5/2020
DE 19817008 B4 9/2004
(Continued)

OTHER PUBLICATIONS

"International Search Report", dated Dec. 1, 2022 (Dec. 1, 2022) for International Application No. PCT/AU2022/051053, 2pgs.
(Continued)

*Primary Examiner* — Gertrude Arthur Jeanglaude
(74) *Attorney, Agent, or Firm* — Buckley, Maschoff & Talwalkar LLC

(57) ABSTRACT

In one preferred form of the present invention, there is provided a road-based traffic sensor comprising: a body having a base and an upper portion; the body housing electronic components including a magnetometer and a battery; the magnetometer for monitoring changes in magnetic field; the body having a slim line configuration and being able to support heavy vehicles travelling at speed; the slim line configuration of the body having a height no more than 25 mm and housing the electronic components; the base for being adhesively secured to the upper surface of the road with negligible damage to the upper surface.

27 Claims, 22 Drawing Sheets

(51) Int. Cl.

| | | |
|---|---|---|
| *E01F 11/00* | (2006.01) | |
| *G01H 11/08* | (2006.01) | |
| *G01R 33/02* | (2006.01) | |
| *G08G 1/042* | (2006.01) | |

(52) U.S. Cl.
CPC ........... *G01R 33/02* (2013.01); *G08G 1/0125* (2013.01); *G08G 1/042* (2013.01)

(56) References Cited

U.S. PATENT DOCUMENTS

| | | | |
|---|---|---|---|
| 4,041,448 | A | 8/1977 | Noens |
| 4,052,595 | A | 10/1977 | Erdmann et al. |
| 4,201,908 | A | 5/1980 | Johnson et al. |
| 4,368,428 | A | 1/1983 | Dijkman |
| 4,509,131 | A | 4/1985 | Krasnjanski |
| 4,680,717 | A | 7/1987 | Martin |
| 5,408,179 | A | 4/1995 | Sampey et al. |
| 5,614,894 | A | 3/1997 | Stanczyk |
| 5,621,314 | A | 4/1997 | Beck et al. |
| 5,748,108 | A | 5/1998 | Sampey et al. |
| 5,877,705 | A | 3/1999 | Sampey |
| 6,121,772 | A | 9/2000 | Shih |
| 6,345,228 | B1 | 2/2002 | Lees et al. |
| 6,417,784 | B1 | 7/2002 | Hilliard et al. |
| 6,546,344 | B1 | 4/2003 | Rodrian et al. |
| 6,611,210 | B2 | 8/2003 | Hilliard et al. |
| 6,838,886 | B2 | 1/2005 | Hilliard et al. |
| 6,988,052 | B2 | 1/2006 | Hilliard et al. |
| 7,765,056 | B2 | 7/2010 | Cattin et al. |
| 8,035,533 | B2 | 10/2011 | Kavaler |
| 8,126,480 | B2 * | 2/2012 | Morrison ......... G08G 1/096716 |
| | | | 455/456.3 |
| 8,487,784 | B2 | 7/2013 | Kavaler |
| 9,311,816 | B2 | 4/2016 | Engler et al. |
| 9,679,487 | B1 * | 6/2017 | Hayward ............. G08G 1/0965 |
| 9,702,098 | B1 | 7/2017 | King |
| 11,236,476 | B2 | 2/2022 | Yamamoto et al. |
| 11,280,053 | B2 | 3/2022 | Yamamoto et al. |
| 11,480,436 | B2 * | 10/2022 | Beaurepaire ....... G01C 21/3885 |
| 2012/0112704 | A1 | 5/2012 | Gottlieb |
| 2012/0249341 | A1 | 10/2012 | Brown et al. |
| 2013/0063282 | A1 | 3/2013 | Baldwin et al. |
| 2017/0140645 | A1 | 5/2017 | Balid et al. |
| 2018/0253964 | A1 | 9/2018 | Wong et al. |
| 2018/0305874 | A1 | 10/2018 | Yamamoto et al. |
| 2019/0194886 | A1 | 6/2019 | Yamamoto et al. |
| 2019/0265015 | A1 | 8/2019 | Michiwaki |
| 2020/0129864 | A1 | 4/2020 | Tran et al. |
| 2020/0199832 | A1 | 6/2020 | Langford et al. |
| 2021/0129864 | A1 | 5/2021 | Wang |
| 2022/0126864 | A1 * | 4/2022 | Moustafa .................. G06T 9/00 |

FOREIGN PATENT DOCUMENTS

| | | |
|---|---|---|
| DE | 102005017287 A1 | 12/2005 |
| DE | 102005041671 B4 | 3/2007 |
| DE | 102006014148 B4 | 10/2007 |
| EA | 044833 B1 | 10/2023 |
| EP | 1559625 A1 | 8/2005 |
| EP | 1646432 A1 | 4/2006 |
| EP | 2306428 A1 | 4/2011 |
| EP | 1646432 B1 | 11/2011 |
| FR | 2820537 A1 | 8/2002 |
| GB | 2 300 291 A | 10/1996 |
| GB | 2517193 A | 2/2015 |
| HU | 218132 B | 3/1998 |
| JP | S5827557 B2 | 2/1983 |
| JP | S5910631 Y2 | 4/1984 |
| JP | 3375968 B2 | 2/2003 |
| KR | 20170020921 A | 2/2017 |
| WO | 1996005095 A1 | 2/1996 |
| WO | 2005080689 A2 | 9/2005 |
| WO | 2007110313 A1 | 10/2007 |
| WO | 2008110200 A1 | 9/2008 |
| WO | 2013082786 A1 | 6/2013 |

OTHER PUBLICATIONS

Cruz, Febus Reidj G., et al. "Magneto-Resistive Sensor Nodes for Vehicle Traffic Detection", 2018 IEEE 10th International Conference Publication, DOI: 10.1109/HNICEM.2018.8666293, download from https://ieeexpiore.ieee.org/abstract/document/8666293, retrieved on Dec. 16, 2025, 2pgs.

Datta, Samrat et al., "Attributes of Direct Measurement of Inductance in a Loop Detector for Traffic Control", University of Texas, draft Mar. 11, 2004, (pp. 1-20, 20 total pages).

Geistler, A. et al., "Detection and classification of turnouts using eddy current sensors", 2004, University of Karlsruhe, 476 Computers in Railways IX, WIT Press, www.witpress.com, ISBN 1-85312-715-9, 10pgs.

Greenslade, F. et al., "The CAPTIF unbound pavement strain measurement system", 2012, Google Scholar, https://patents.google.com/scholar/12197081364636588990?oq=US5408179, downloaded Dec. 16, 2025, 2pgs.

Haoui, Amine et al., "Wireless magnetic sensors for traffic surveillance", ScienceDirect, Transportation Research Part C: Emerging Technologies, vol. 16, Issue 3, Jun. 2008, https://doi.org/10.1016/j.trc.2007/10/004, downloaded Dec. 1, 2026, (pp. 294-306, 5 total pages).

Cheung, Sing Yiu et al., "Traffic Surveillance with Wireless Magnetic Sensors", Paper 4779, Conference Paper, Nov. 2005, https://www.researchgate.net/publication/268980713, 14pgs.

Markevicius, Vytautas et al., "An Effective Method of Vehicle Speed Evaluation in Systems Using Anisotropic Magneto-Resistive Sensors", IEEE Intelligent Transportation Systems Magazine, IEEE, USA, vol. 13, No. 2, Feb. 7, 2019 (Feb. 7, 2019), pp. 142-151, XP011856486, ISSN: 1939-1390, DOI: 0.1109/MITS.2018.2889693 [retrieved on May 23, 2021].

* cited by examiner

WIRELESSLY RECERIVE WAVEFORM, TIMESTAMP AND SENSOR IDENTIFICATION INFORMATION.

Fig. 19

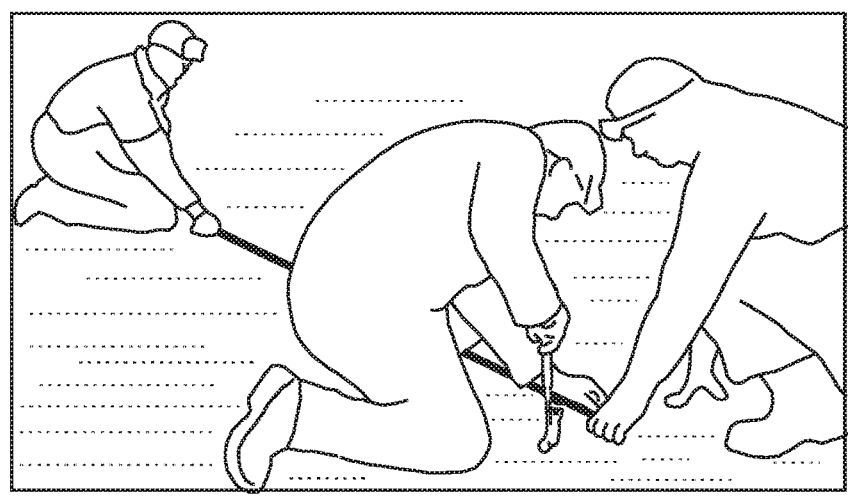
Fig 21a
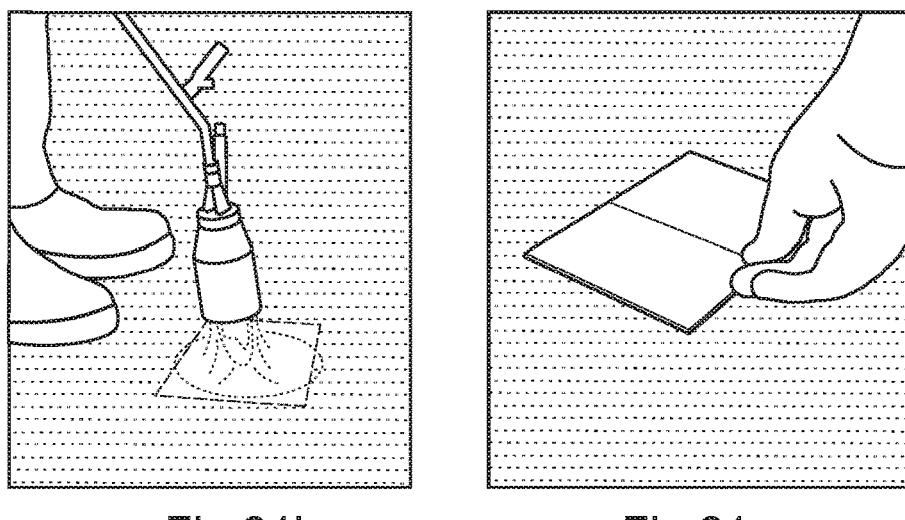
Fig 21b
Fig 21c
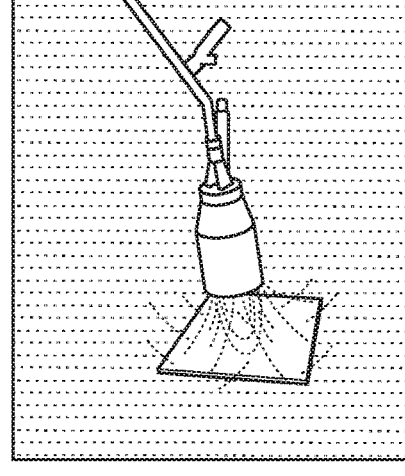
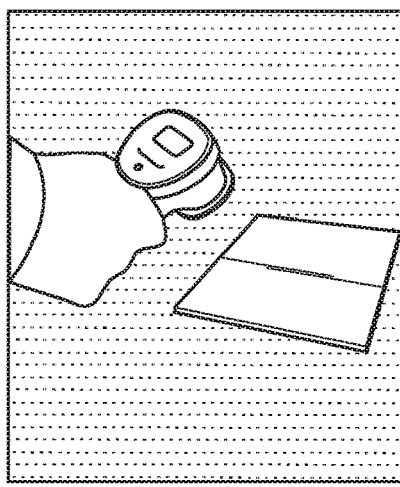
Fig 21d
Fig 21e

SENSOR ARRAYS, METHODS, SYSTEMS AND DEVICES

This application is a U.S. National Stage filing under 35 U.S.C. § 371 and 35 U.S.C. § 119, based on and claiming priority to PCT/AU2022/051053, filed Aug. 25, 2022 and AU patent application No. 2021107499, filed Aug. 25, 2021.

FIELD OF THE INVENTION

The present invention relates to mobile object detection, logging, data processing and analysing systems and methods, components thereof and accessories thereto. The invention has particular, but not exclusive, utility in one embodiment to ascertaining vehicular movement in road-based traffic systems and the apparatus and methodologies deployed to detect, log, process and analyse data in respect of same and in particular the sensors for capturing this data.

In other embodiments, the invention has utility in sensing mobile objects traversing over or near where the sensor is surmounted on a surface of a substrate Throughout the specification, unless the context requires otherwise, the word "comprise" or variations such as "comprises" or "comprising", will be understood to imply the inclusion of a stated integer or group of integers but not the exclusion of any other integer or group of integers.

BACKGROUND ART

The following discussion of the background art is intended to facilitate an understanding of the present invention only. It should be appreciated that the discussion is not an acknowledgement or admission that any of the material referred to was part of the common general knowledge as at the priority date of the application.

The monitoring of road networks using road-based traffic sensors is important for the purpose of road network maintenance and improvement.

A number of devices, systems and approaches are available in the market for traffic monitoring.

It would be advantageous if these devices could be improved, or if the public could at least be provided with a useful choice.

DISCLOSURE OF THE INVENTION

According to one aspect of the embodiments herein described, there is provided a mobile object sensor comprising: a body having a base and an upper portion; the body housing electronic components including a magnetometer and a battery; the magnetometer for monitoring changes in magnetic field; the body having a slim line configuration and being able to support objects travelling at speed over the sensor; the slim line configuration of the body having a low profile to allow for objects travelling thereover in a relatively unimpeded manner at a variety of speeds; the base being of substantially planar configuration for being adhesively secured to the upper surface of a substrate on which the objects traverse to ensure negligible damage to the upper surface.

In one embodiment, the height of the body in situ is no more than approximately 25 mm above the upper surface and the speed of objects travelling thereover being variable from anywhere above 0 km/hr to 180 km/hr or more.

In an alternative embodiment, the sensor is disposed in a shallow depression formed in the upper surface of the substrate, whereby the height of the body in situ is substantially coplanar or marginally below the planar of the upper surface In another embodiment, the sensor includes a wireless transmitter for sending information based on or comprising data collected by the magnetometer for traffic analysis.

In a further embodiment, the electronic components include a solar cell for recharging the battery; the road-based traffic sensor being self-rechargeable using the sun.

In another embodiment, the electronic components are arranged in a layered structure including a first layer comprising the solar cell; and a further layer comprising the remaining electronic components and the battery.

In a further embodiment, the further layer comprises a first layer of electronics and a second layer including the battery, the first layer being no more than 0.8 cm in height; and the second layer being no more than 0.8 cm in height.

In another embodiment, the layered structure includes cushioning layers, each cushioning layer having elastomeric properties for distributing force over the layers of electronic components.

In a further embodiment, the cushioning layers are configured to protect the electronic components from mechanical stress from mechanical shock waves, shear forces and thermal expansion.

In another embodiment, the cushioning layers are no less than 0.1 mm thick vertically in the layered structure.

In a further embodiment, the cushioning layers have a shore hardness between A10 to A20.

In another embodiment, the body includes an up ramp, a down ramp; and a central portion between the up ramp and the down ramp; the central portion for housing the layered structure.

In a further embodiment, the body includes rigid reinforcing portions extending from the sides of the body to the central portion for providing rigidity to the slim line configuration.

In another embodiment, the road-based traffic sensor includes a cushioning surround that surrounds the electric components for dispersing and absorbing mechanical shock waves.

In a further embodiment, the cushioning surround is at least 0.1 mm in thickness.

In another embodiment, the cushioning surround is at least 0.5 mm in thickness.

In a further embodiment, the body comprises a rigid housing having the layered structure therein along with a rigid filler that fills the remaining internal cavities of the body.

In another embodiment, the road-based traffic sensor includes a sampler, the sampler for sampling changes in magnetic field by activating the magnetometer; the sampler using the sampled magnetic field to control the sampling.

In a further embodiment, the road-based traffic sensor includes a sampler and a vibration sensor, the sampler for sampling changes in magnetic field by activating the magnetometer; the sampler using the vibration sensor to control the sampling in response to vibration levels.

In another embodiment, the battery when fully charged provides for at least 50 days of use with moderate traffic without solar recharging.

In a further embodiment, the battery when fully charged provides for at least 90 days of use with moderate traffic without solar recharging.

In another embodiment, in sunny conditions, from a couple of hours prior to midday to a couple of hours after, the solar panel can put 12 hours' worth of runtime energy into the battery in an hour or less.

In a further embodiment, the three-dimensional size of the body is equal to or less than 100 mm by 80 mm by 21 mm in all three dimensions.

In another embodiment, the three-dimensional size of the body is equal to or less than 100 mm by 80 mm by 15 mm in all three dimensions.

In a further embodiment, the body includes an up ramp, a down ramp and a central portion between the up ramp and the down ramp for housing the electronic components with rigid reinforcing portions extending from the sides of the body to the central portion for providing rigidity to the slim line configuration.

In another embodiment, the road-based traffic sensor is configured to wirelessly send time-stamped magnetometer field information along with a sensor identifier.

In a further embodiment, the sensor is configured to be effectively agnostic of its placement in a sensor array, when operating in a sensor array for determining traffic flow, vehicle speed or another characteristic.

According to an aspect of the embodiments herein described there is provided a road-based traffic sensor including a sampler, the sampler for sampling the magnetic field by activating a magnetometer; the sampler using a measured characteristic to control the sampling.

In one embodiment, the measured characteristic comprises the sampled magnetic field.

In another embodiment, the road-based traffic sensor includes a vibration sensor and the measured characteristic comprises vibration measured using the vibration sensor.

In a further embodiment, the sampler is configured to use the measured characteristic to provide early warning of nearby vehicular traffic and increases magnetic field sampling in response thereto.

In another embodiment, the sampler is configured to control sampling by increasing magnetic field sampling by a factor of at least 2 when the measured characteristic indicates oncoming traffic.

In a further embodiment, the sampler is configured to control sampling by increasing magnetic field sampling by a factor of at least 3 when the measured characteristic indicates oncoming traffic.

In another embodiment, the sampler is configured to control sampling by increasing magnetic field sampling by a factor of at least 5 when the measured characteristic indicates oncoming traffic.

According to an aspect of the embodiments herein described there is provided a method of road traffic data collection including using a sampler to sample the magnetic field by activating a magnetometer; and controlling the sampling in response to a measured characteristic.

In another embodiment, the measured characteristic comprises the sampled magnetic field.

In a further embodiment, wherein the measured characteristic comprises vibration, measured using a vibration sensor.

In another embodiment, the method includes providing early warning of nearby vehicular traffic and increasing the magnetic field sampling in response thereto.

In a further embodiment, the method includes controlling sampling by increasing magnetic field sampling by a factor of at least 2 when the measured characteristic indicates oncoming traffic.

In another embodiment, the method includes controlling sampling by increasing magnetic field sampling by a factor of at least 3 when the measured characteristic indicates oncoming traffic.

In a further embodiment, the method includes controlling sampling by increasing magnetic field sampling by a factor of at least 5 when the measured characteristic indicates oncoming traffic.

According to an aspect of the embodiments herein described there is provided a road based traffic sensor including a sampler and vibration sensor, the sampler for sampling changes in magnetic field by activating a magnetometer; the sampler using the vibration sensor to control the sampling in response to vibration.

According to another aspect of the embodiments herein described there is provided a method of road traffic data collection including using a sampler to sample magnetic field; and controlling the sampling in response to a vibration sensor.

According to a further aspect of the embodiments herein described there is provided a method of road traffic data collection comprising: providing sensor arrays of surface mounted wireless sensors on a road network; at least some of the arrays each comprising three or more surface mounted wireless sensors spaced along a corresponding section of road; receiving information from the sensors; and analysing received information to determine vehicle speed information with the analysis including compensating for surface mounted wireless road-based sensors having become separated from the road or are otherwise malfunctioning.

In another embodiment, each sensor is configured to be effectively agnostic of its placement in the corresponding sensor array.

In a further embodiment, analysing the information is provided by a system that is separate from the sensors.

In another embodiment, the sensor arrays send magnetometer information to sensor gateways, and the sensor gateways are agnostic of the placements of the sensors.

In a further embodiment, analysing the information is performed by a system that is separate from the sensor gateways and sensor.

In another embodiment, analysing the received information includes using combinations of sensor measurements in each array to improve accuracy.

In a further embodiment, the method includes accounting for incorrect physical spacing measurements between the sensors in an array.

In another embodiment, analysing the information is performed within less than 15 minutes after sensors send the information.

In a further embodiment, analysing the information is performed within less than 5 minutes after sensors send the information.

In another embodiment, the method includes proactively issuing alerts to limit the number of surface mounted wireless road-based sensors that are separated from the road or are otherwise malfunctioning, enabling repair or reinstatement of any sensor prior to any loss of volume, speed or classification/length data.

In a further embodiment, the method includes proactively issuing alerts when a sensor array approaches a single functioning surface mounted wireless road-based sensor due to surface mounted wireless road-based sensors having become separated from the road or are otherwise malfunctioning.

According to still a further aspect of the embodiments herein described there is provided a system for traffic analysis comprising: sensor arrays of surface mounted wireless road-based sensors for being placed in a road network with at least some of the sensor arrays each comprising at least three surface mounted wireless road-based sensors spaced along a corresponding section of road; a receiver for receiving information from the sensors; and an analyser for analysing received information to determine vehicle speed information, the analyser being configured to compensate for surface mounted wireless road-based sensors having become separated from the road or are otherwise malfunctioning.

In a further embodiment, each sensor is configured to be effectively agnostic of its placement in a sensor array.

In another embodiment, the analyser is provided by a system facility separate from the sensors.

In a further embodiment, the system includes sensor gateways for receiving information from the sensor arrays, and the sensor gateways are agnostic of the placements of the sensors.

In another embodiment, the analyser is provided by a system facility that is separate from the sensor gateways and the sensors.

In a further embodiment, the analyser is configured to use combinations of sensor measurements in each array to improve accuracy.

In another embodiment, the analyser is configured to account for incorrect physical spacing measurements between the sensors in an array.

In a further embodiment, the system is configured to analyse the information within less than 5 minutes after sensors send the information.

In another embodiment, the system includes a notifier for proactively issuing alerts to limit the number of surface mounted wireless road-based sensors that become separated from the road or are otherwise malfunctioning.

In a further embodiment, the system includes a notifier for proactively issuing alerts when a sensor array approaches a single functioning surface mounted wireless road-based sensor due to surface mounted wireless road-based sensors having become separated from the road or are otherwise malfunctioning.

According to another aspect of the embodiments herein described there is provided a method of adding one or more sensors to a road network comprising: providing arrays of surface mounted wireless sensors on a road network; with respect to each array, physically separating sensors in a predetermined manner along the section of road associated with the array; receiving information from the sensors; and analysing the received information to associate added sensors with arrays; the added sensors having been added to replace sensors that have become separated from the road or are otherwise malfunctioning.

In a further embodiment, the analysis includes monitoring measurements to determine whether added sensors provide measurements associated with times indicating that they should be associated with an array.

In another embodiment, within each array, the sensors are separated by a predetermined distance.

In a further embodiment, the distance is between 4 to 10 m.

According to an aspect of the embodiments herein described there is provided a road traffic analysis system including: arrays of surface mounted wireless sensors for being positioned in a road network with, in each array, the sensors being physically separated in a predetermined manner along the section of road associated with the array; a receiver for receiving information from the sensors; and an analyser for analysing the received information to associate added sensors with arrays; the added sensors having been added to replace sensors that have become separated from the road or are otherwise malfunctioning.

In a further embodiment, the analyser is configured to monitor measurements to determine whether added sensors provide measurements associated with times indicating that they should be associated with an array.

In another embodiment, within each array, the sensors are separated by a predetermined distance.

In each of the methods and system the analysis by the analyser is computer implemented. With a large number of sensors, the automated nature of the analysis may require a relatively large degree of computer processing power.

It is to be recognised that other forms and advantages of further embodiments will be apparent from the drawings and description of the embodiments, and the claims provided below.

Further advantages and preferred features will be apparent from the drawings and a reading of the specification as a whole.

BRIEF DESCRIPTION OF THE DRAWINGS

In order to facilitate a better understanding of the present invention, several preferred embodiments will now be described with reference to the accompanying drawings, in which:

FIGS. 1 to 10 provide various views of a road traffic sensor according to a first preferred embodiment of the present invention, wherein:

FIG. 1 is an end view of the road traffic sensor;

FIG. 2 is a top view of the road traffic sensor;

FIG. 3 is a bottom perspective view of the road traffic sensor;

FIG. 4 is a side perspective view of the road traffic sensor with the top removed;

FIG. 5 is a plan view of FIG. 4;

FIG. 6 is a top view and end view of the general outline of the road traffic sensor;

FIG. 7 are various plan, front and side perspective views of the road traffic sensor;

FIG. 8 is a more detailed view of FIG. 6;

FIG. 9 is another detailed view of the end and side of the road traffic sensor;

FIG. 10 is a fragmentary sectional view showing the compartments for the electronic components within the road traffic sensor;

Figure 19:
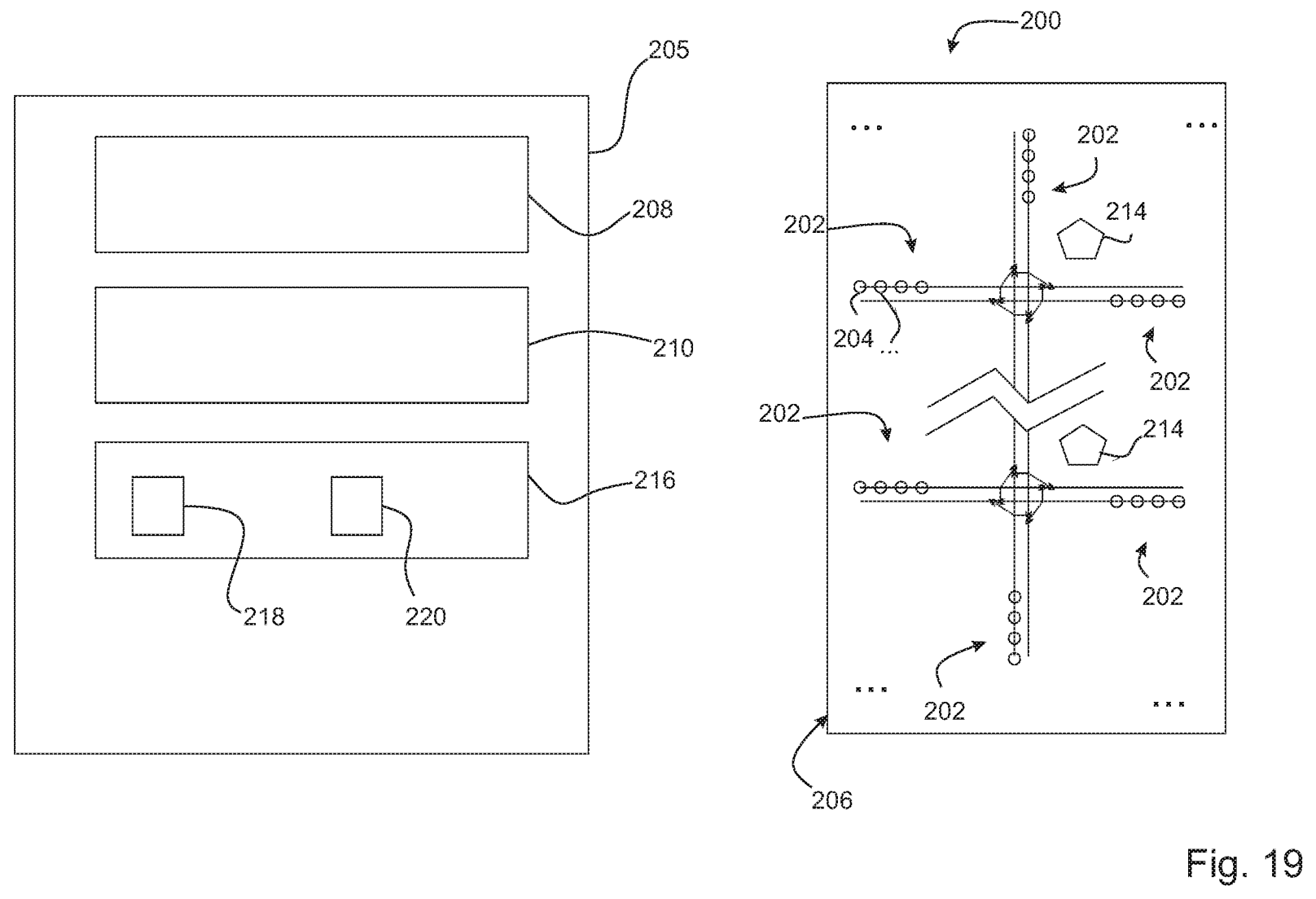

FIG. 19 provides various views of a system according to a preferred embodiment of the present invention;

FIG. 21 comprises a series of photographs showing how an in-road sensor is installed on a section of road, wherein:

FIG. 21*a* shows marking of a section of road for the sensor;

FIG. 21*b* shows heating of the road surface and FIG. 21*c* shows placement of a mounting pad;

FIGS. 21*d* and 21*e* show heating of the mounting pad to a prescribed temperature for bonding;

BEST MODE(S) FOR CARRYING OUT THE INVENTION

It is to be appreciated that each of the embodiments is specifically described and that the present invention is not to be construed as being limited to any specific feature or element of any one of the embodiments. Neither is the present invention to be construed as being limited to any feature of a number of the embodiments or variations described in relation to the embodiments.

Figure 1:
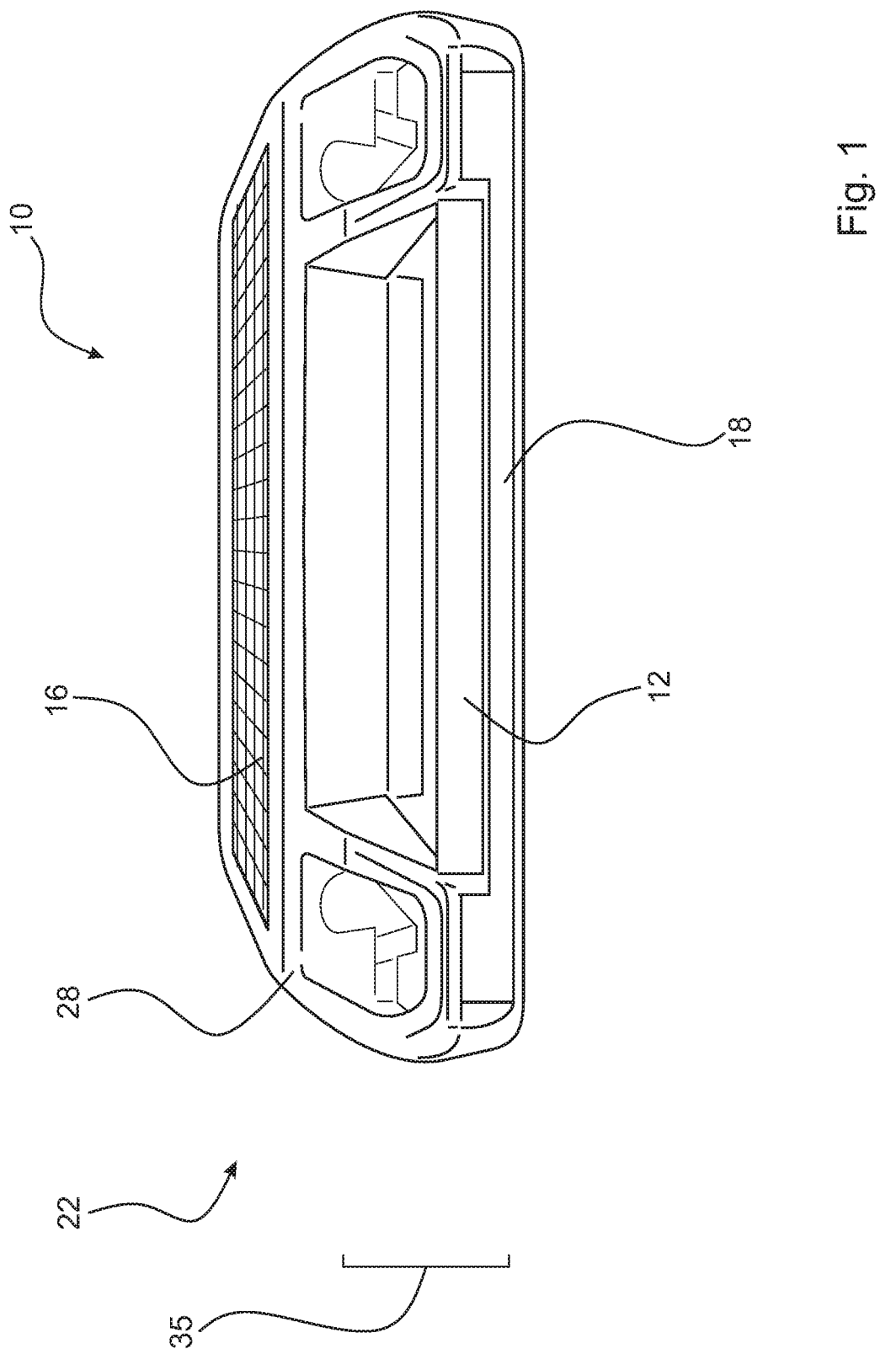
Figure 2:
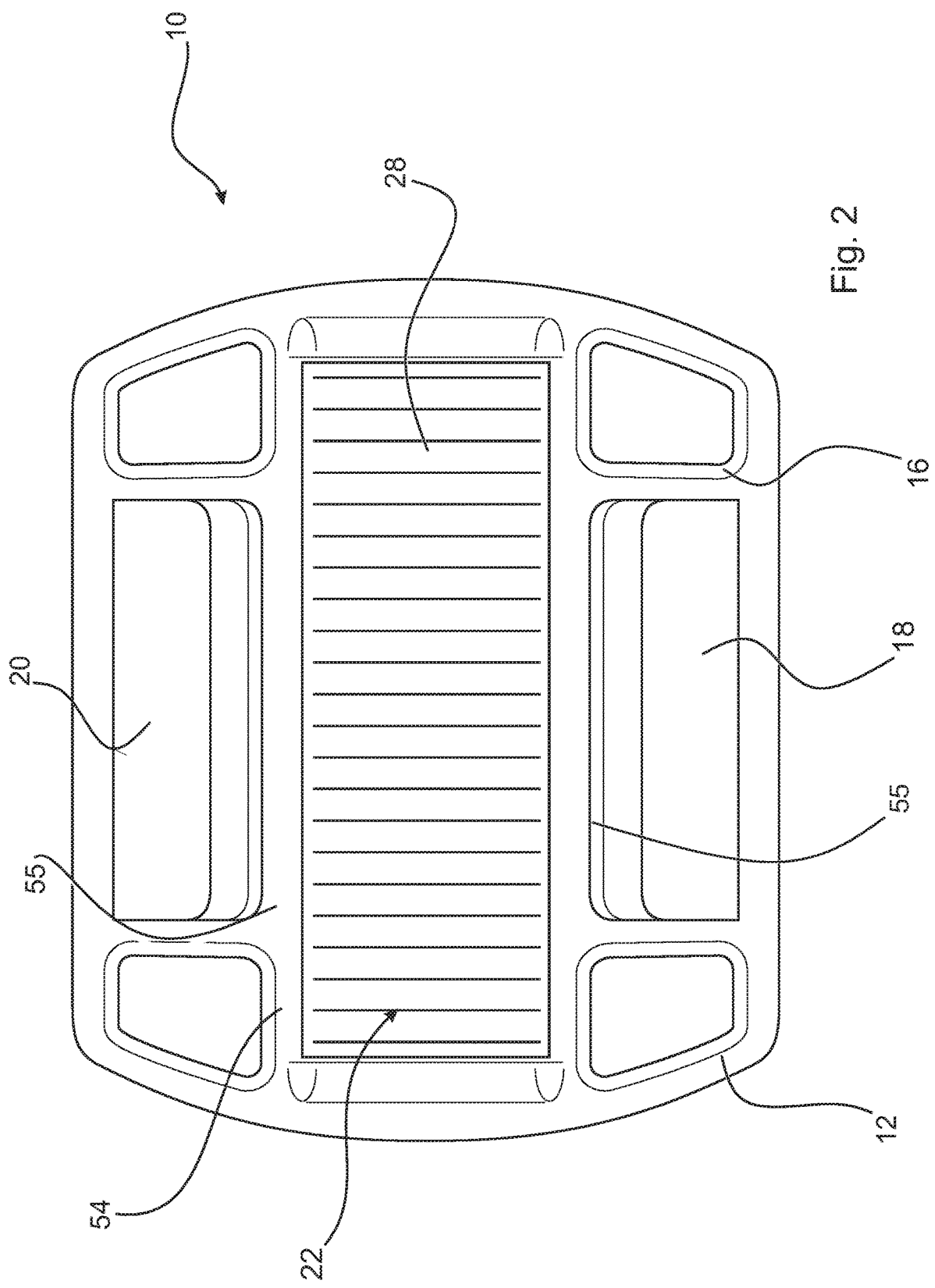

Referring to FIG. 1 there is shown a road-based traffic sensor 10 according to a first preferred embodiment of the present invention.

Figure 3:
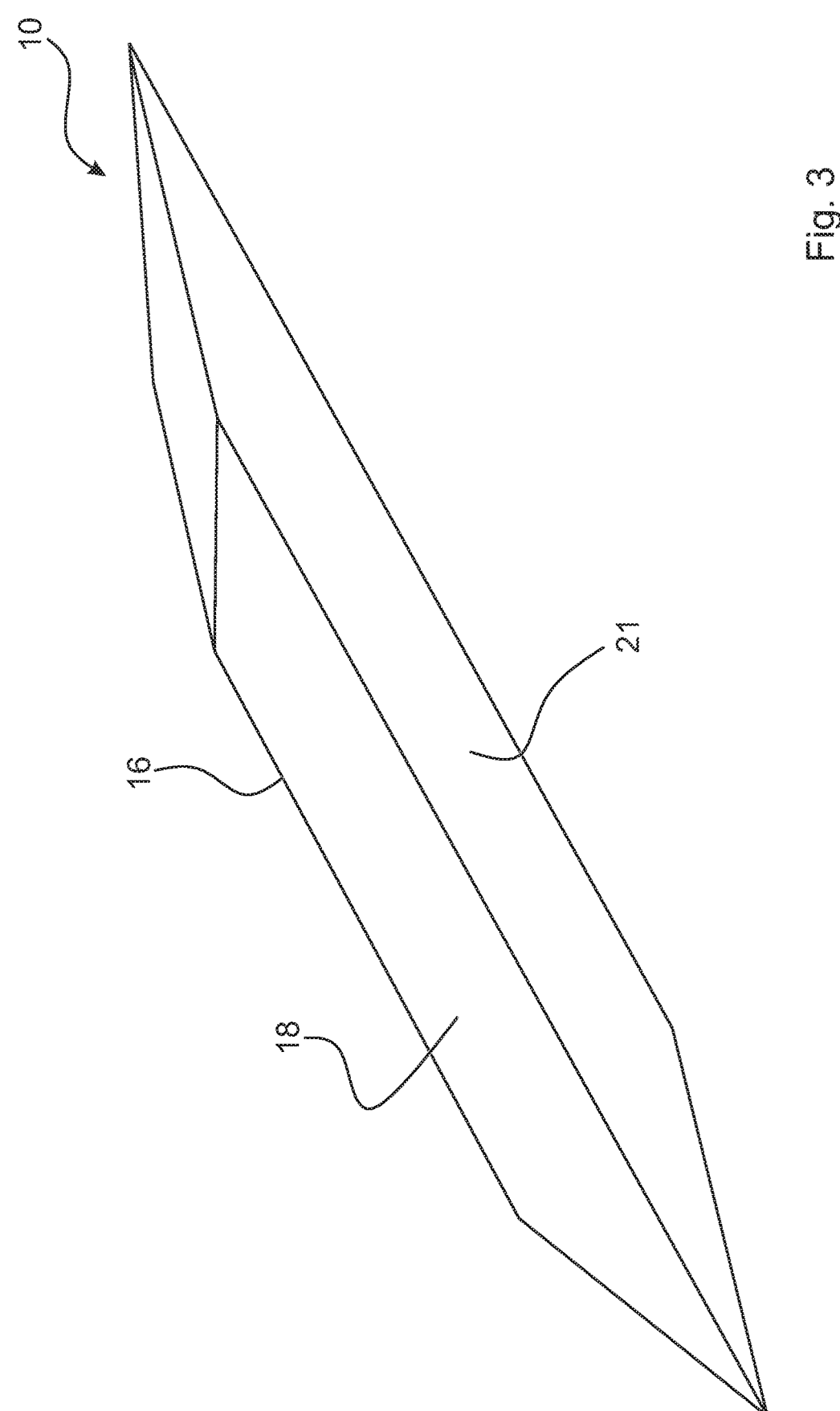
Figure 4:
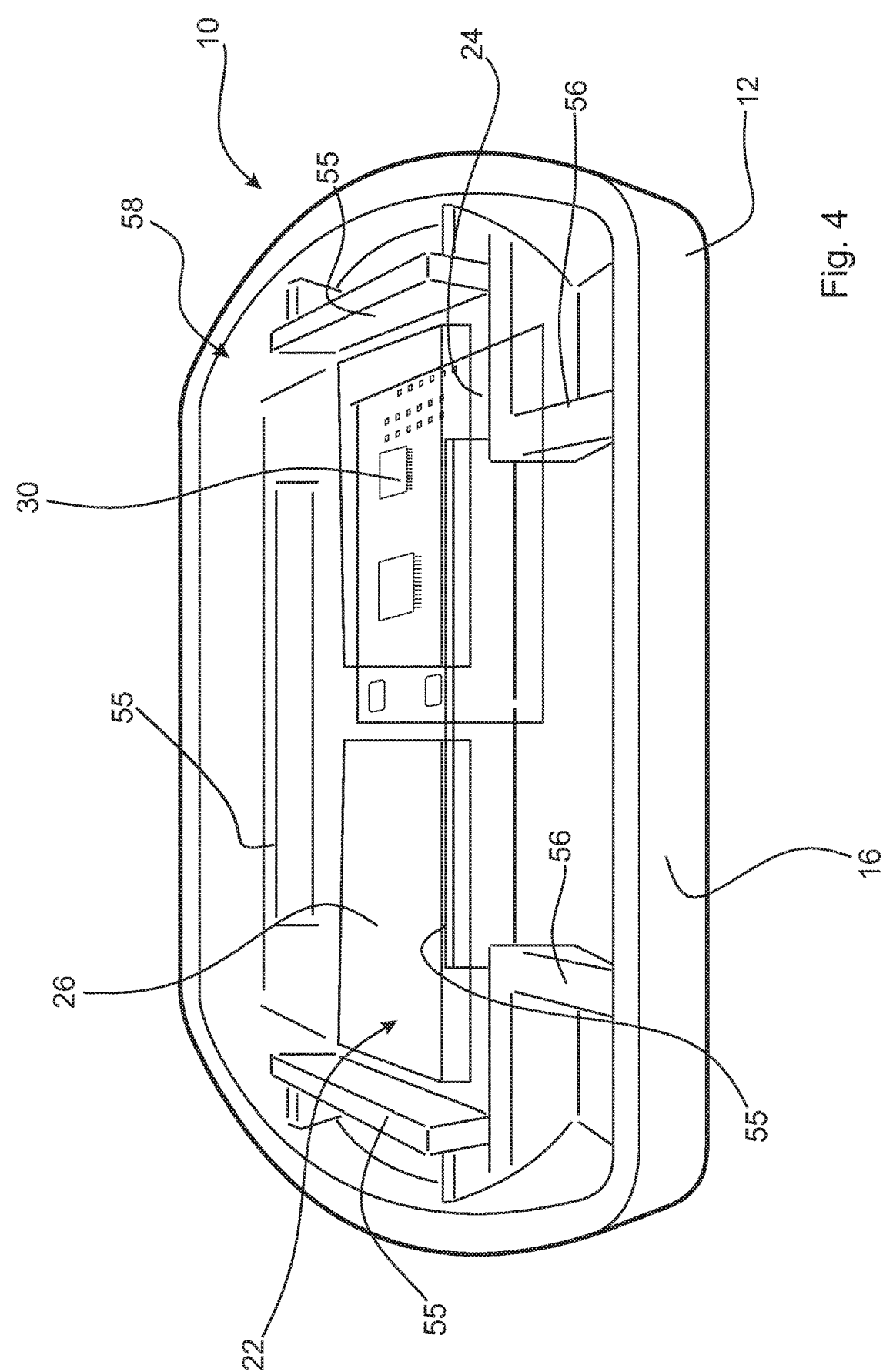
Figure 5:
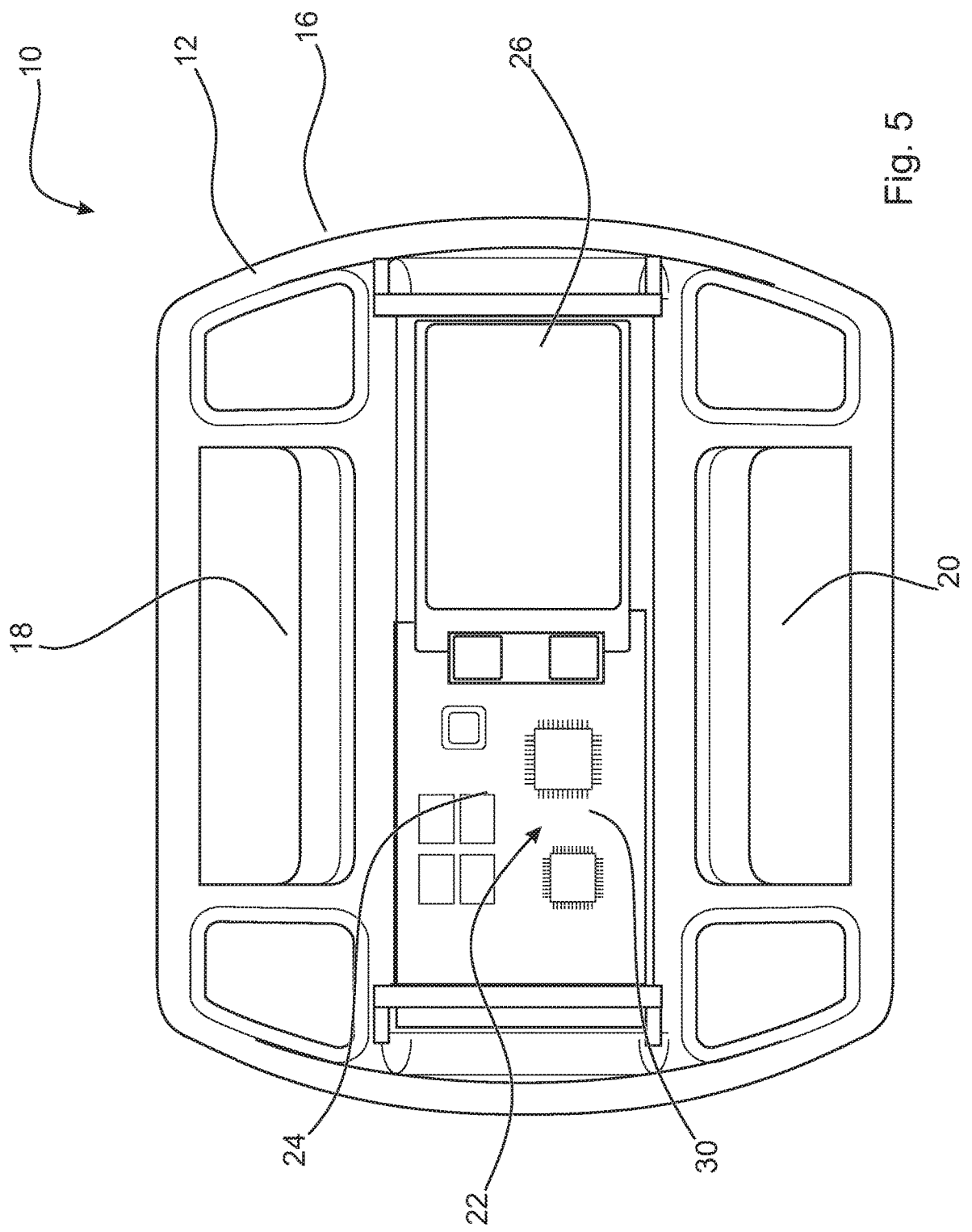
Figure 6:
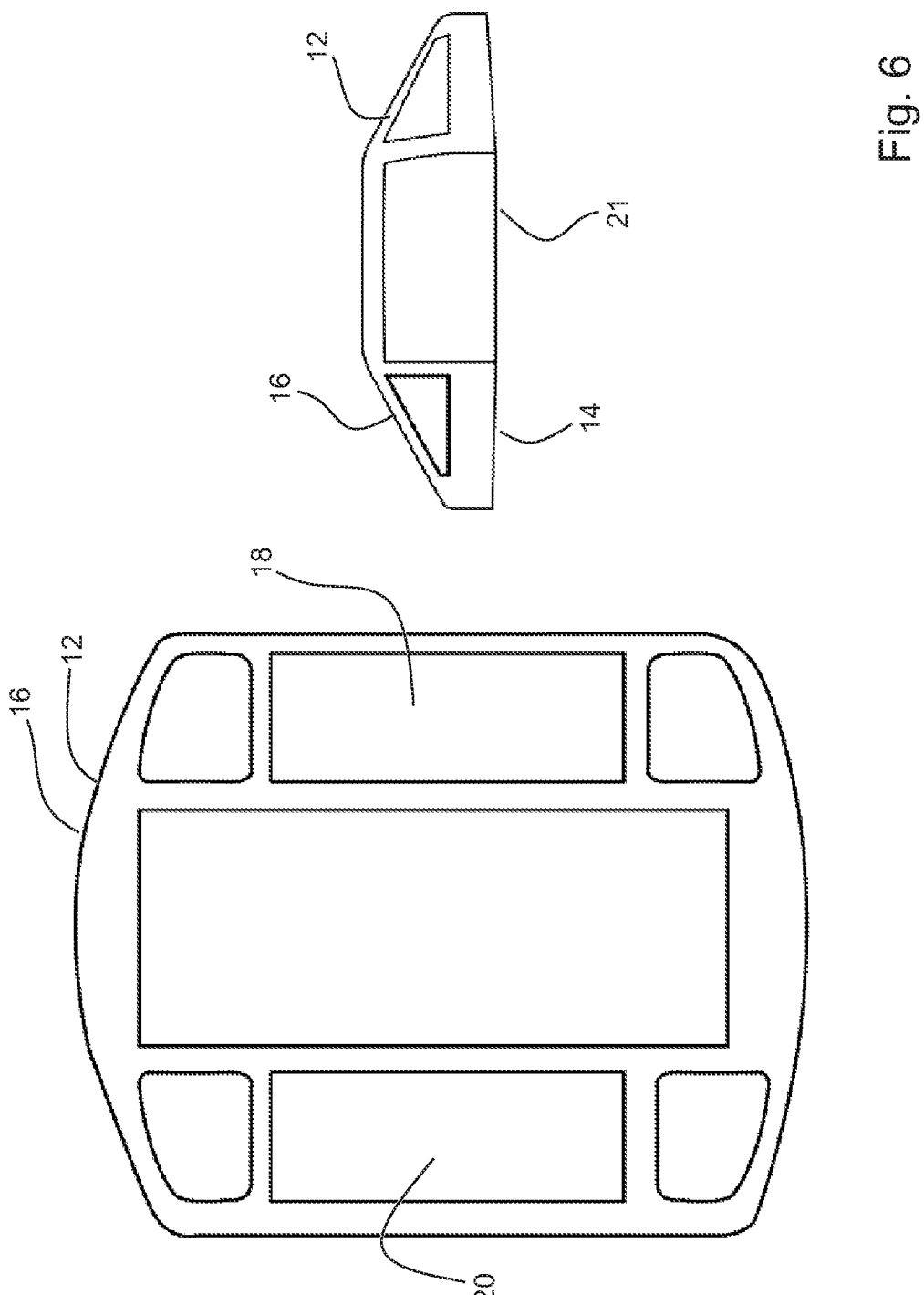
Figure 7:
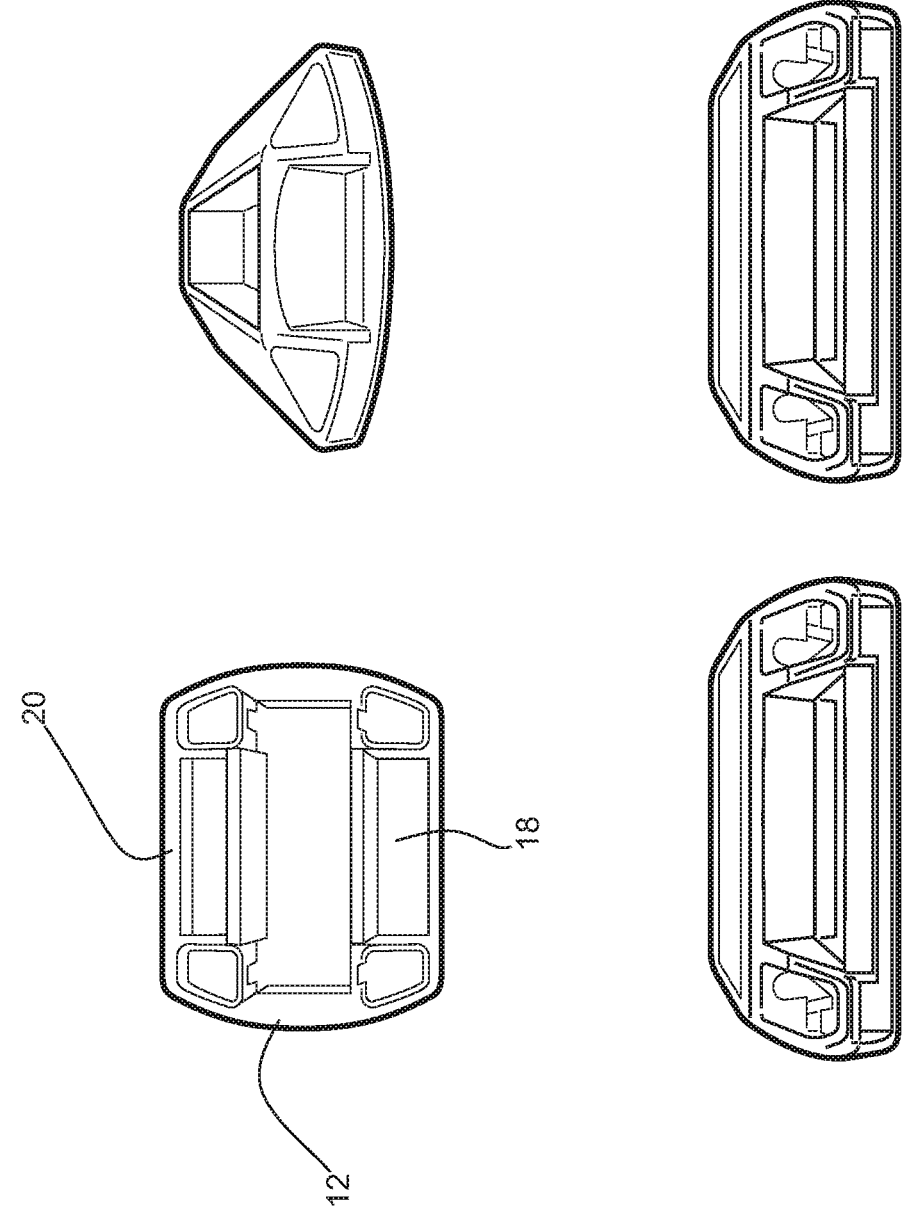
Figure 8:
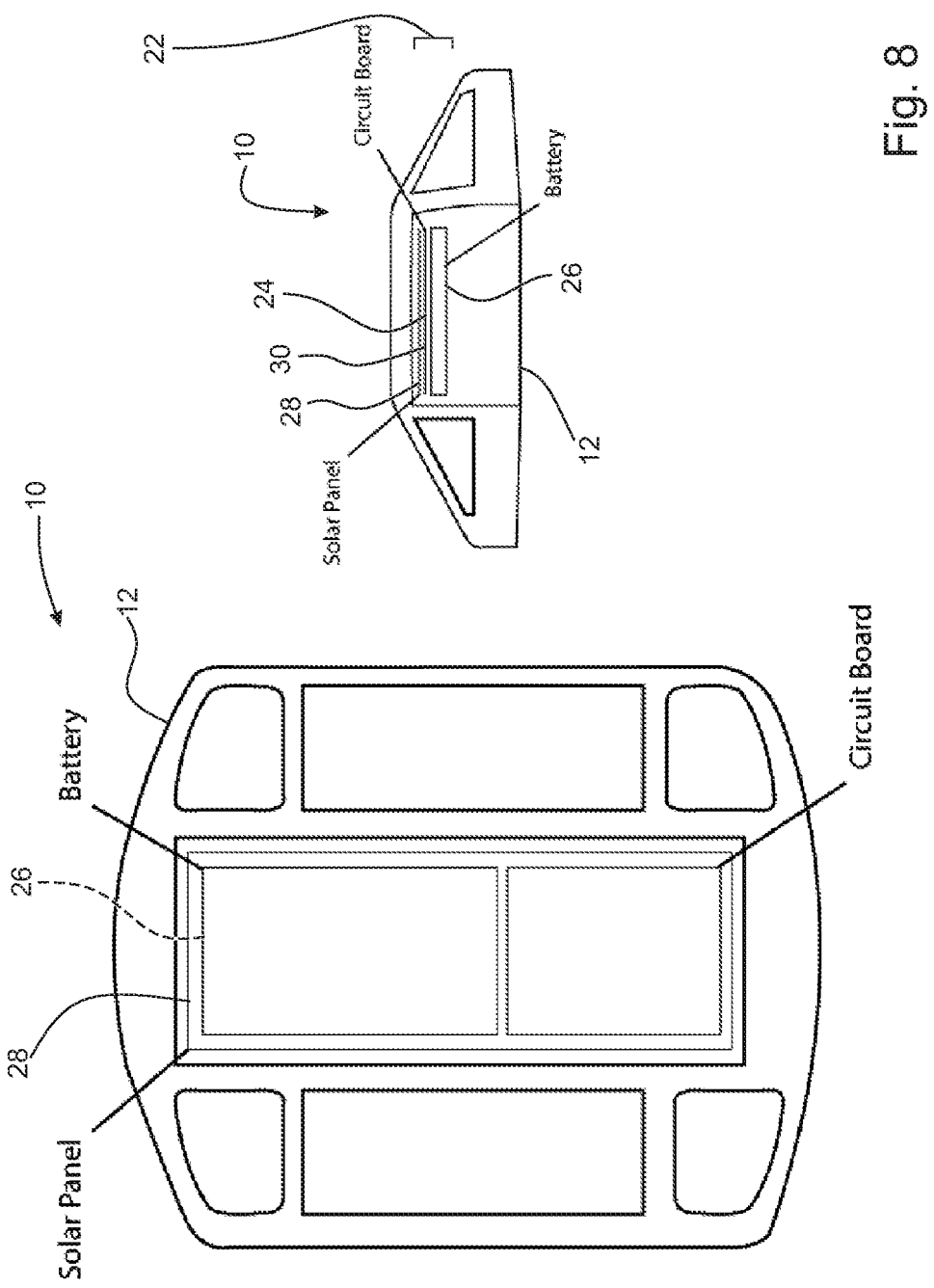
Figure 9:
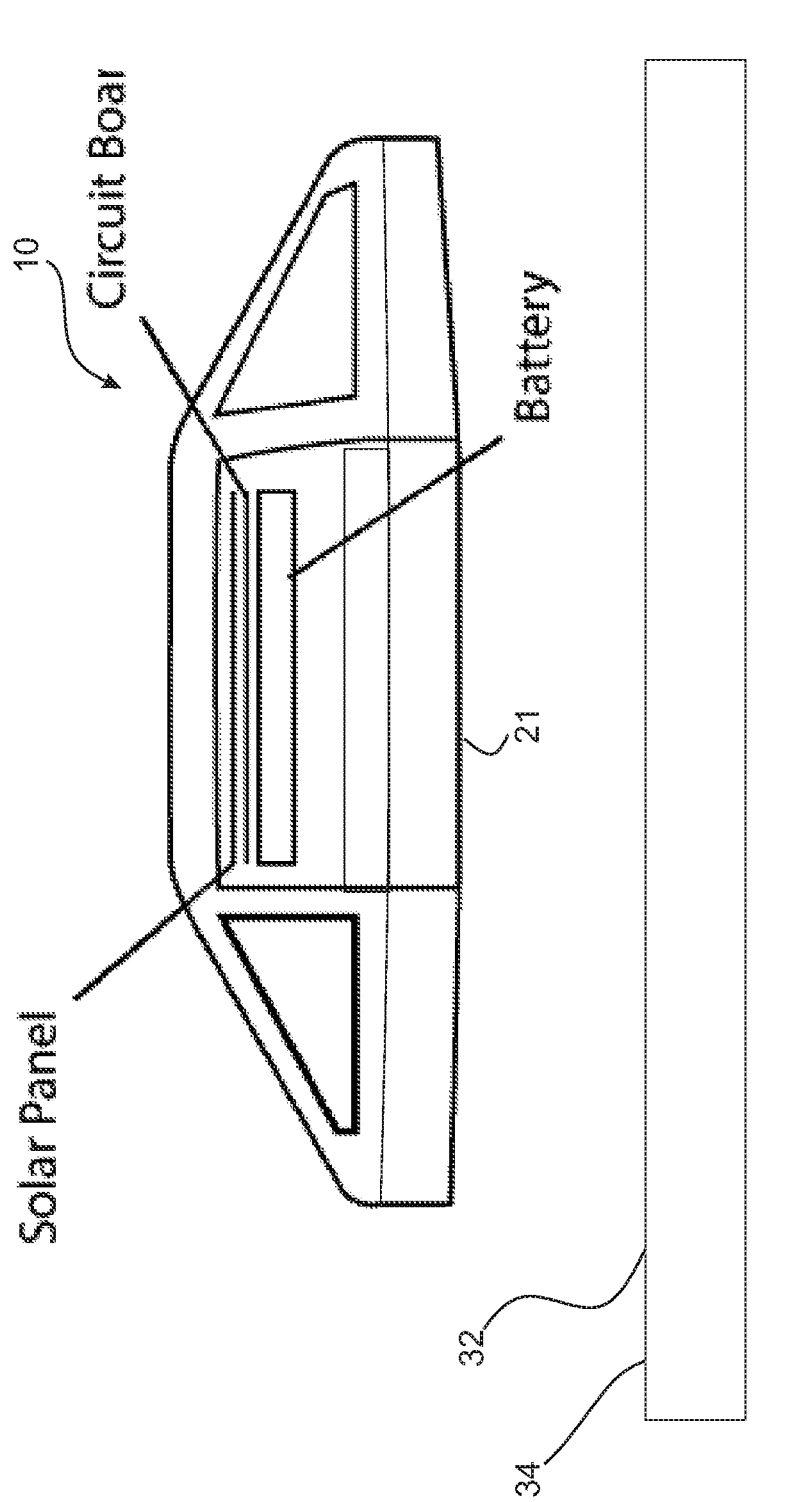
Figure 10:
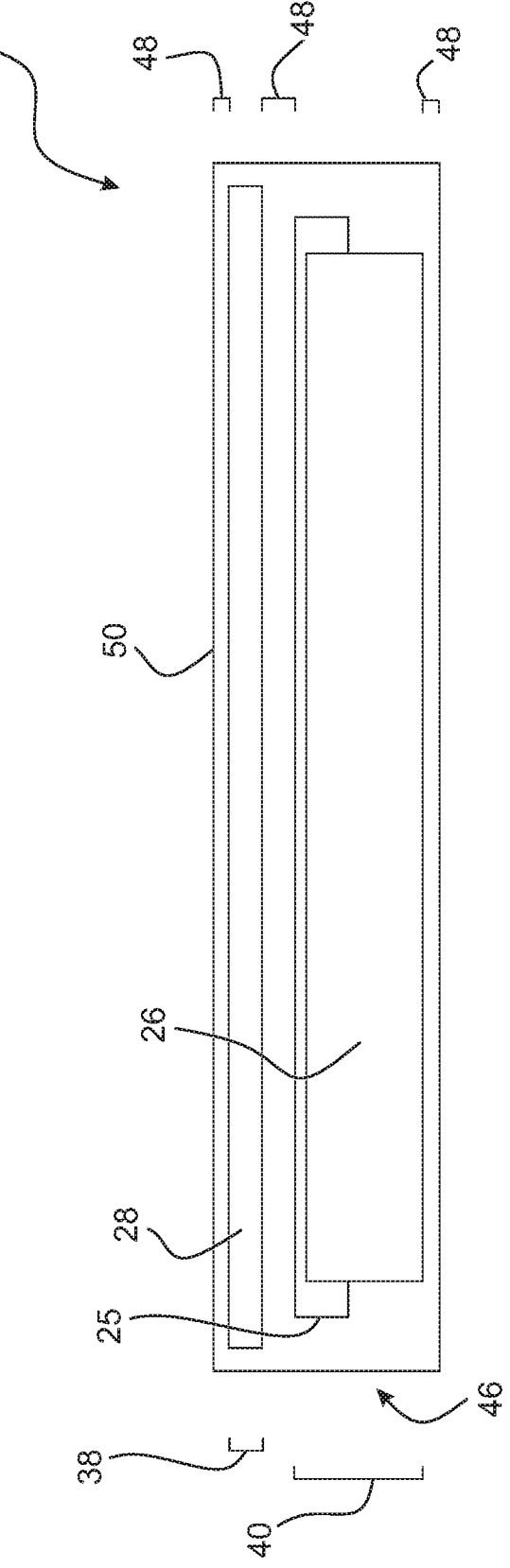
Figure 11:
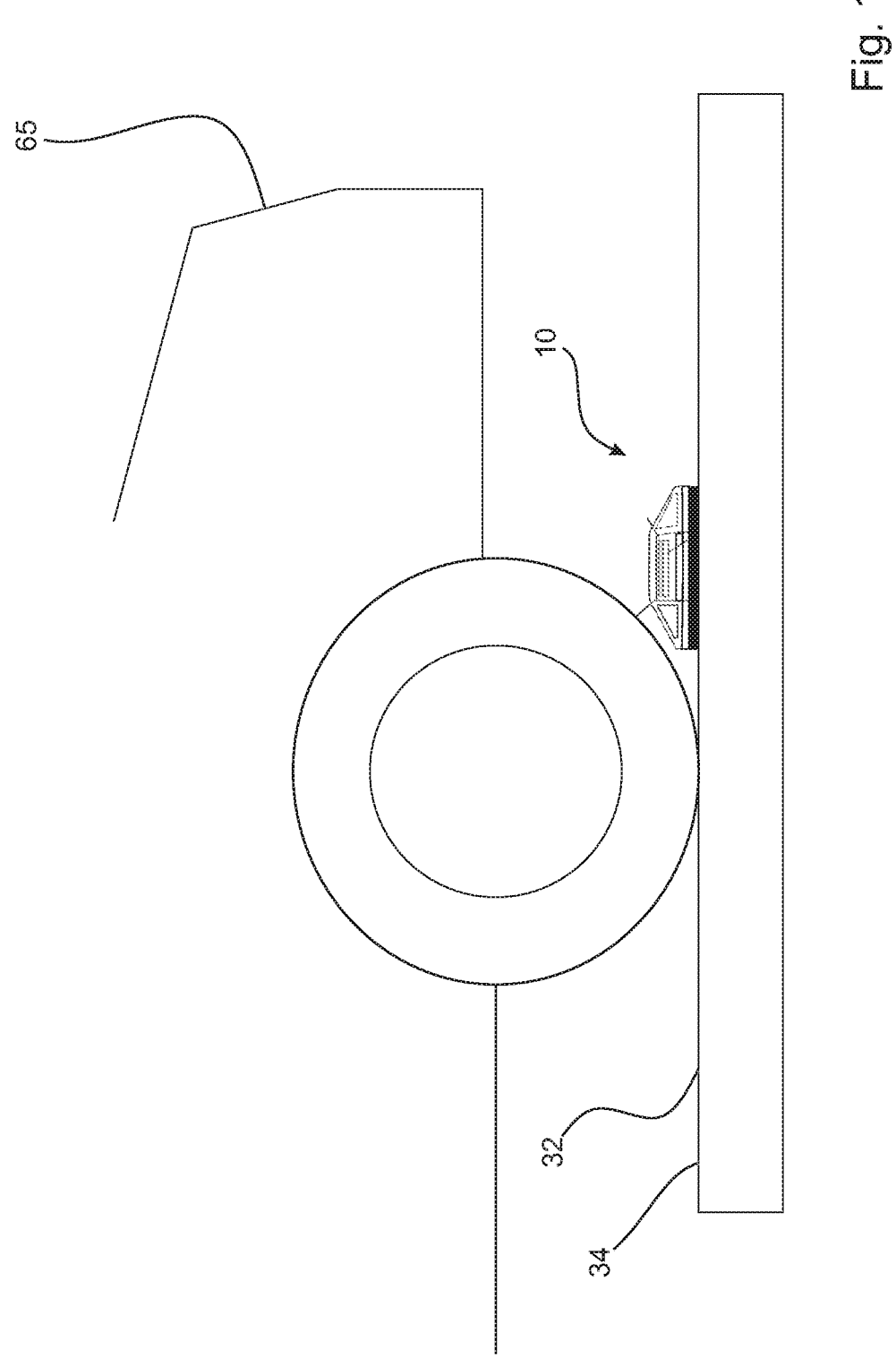
FIGS. 11 to 12 provide various views of the road traffic sensor according to the first preferred embodiment of the present invention.
Figure 12:
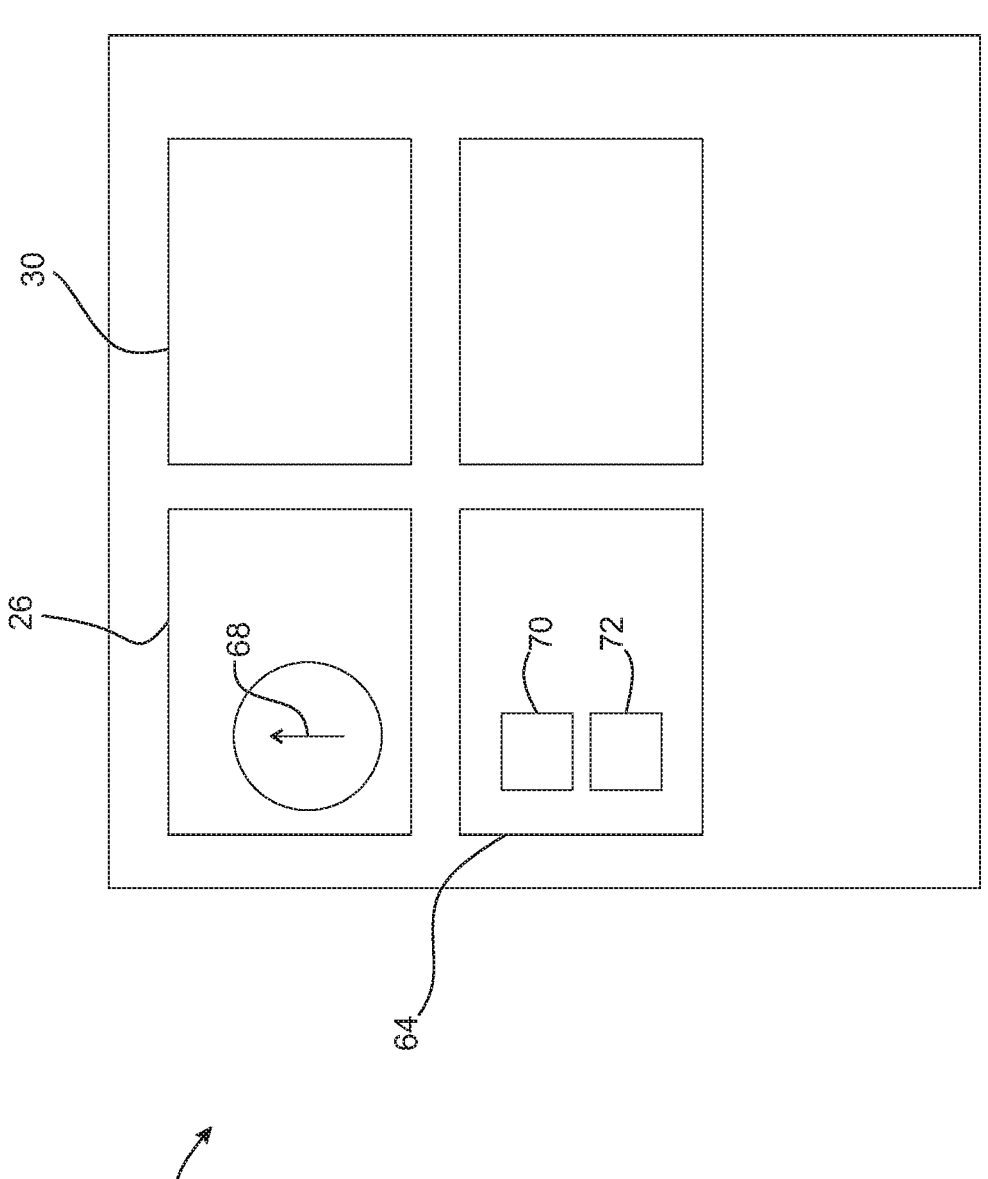
Figure 13:
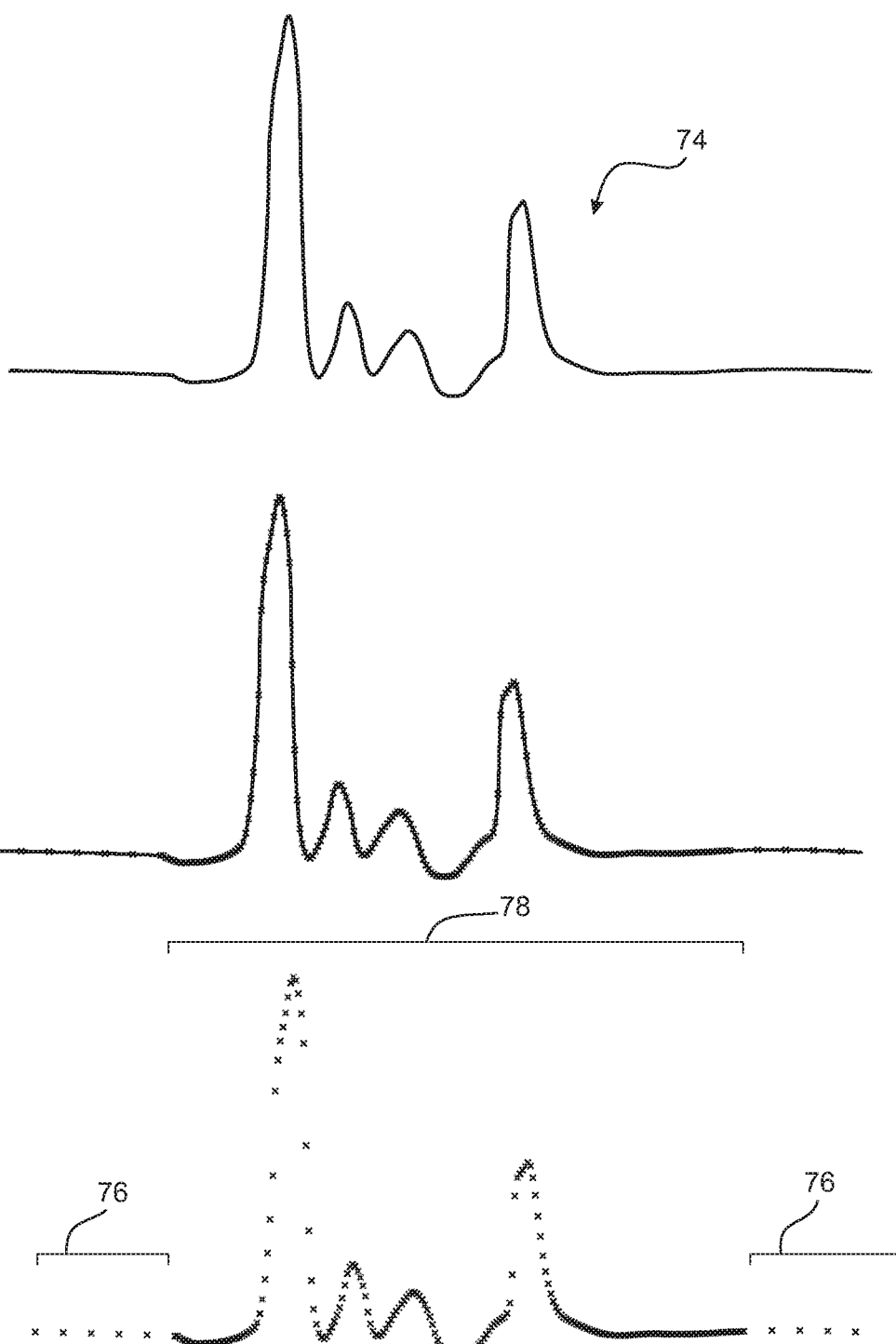
FIG. 13 provides various further views relating to the road traffic sensor shown in FIGS. 1 to 12.
Figure 14:
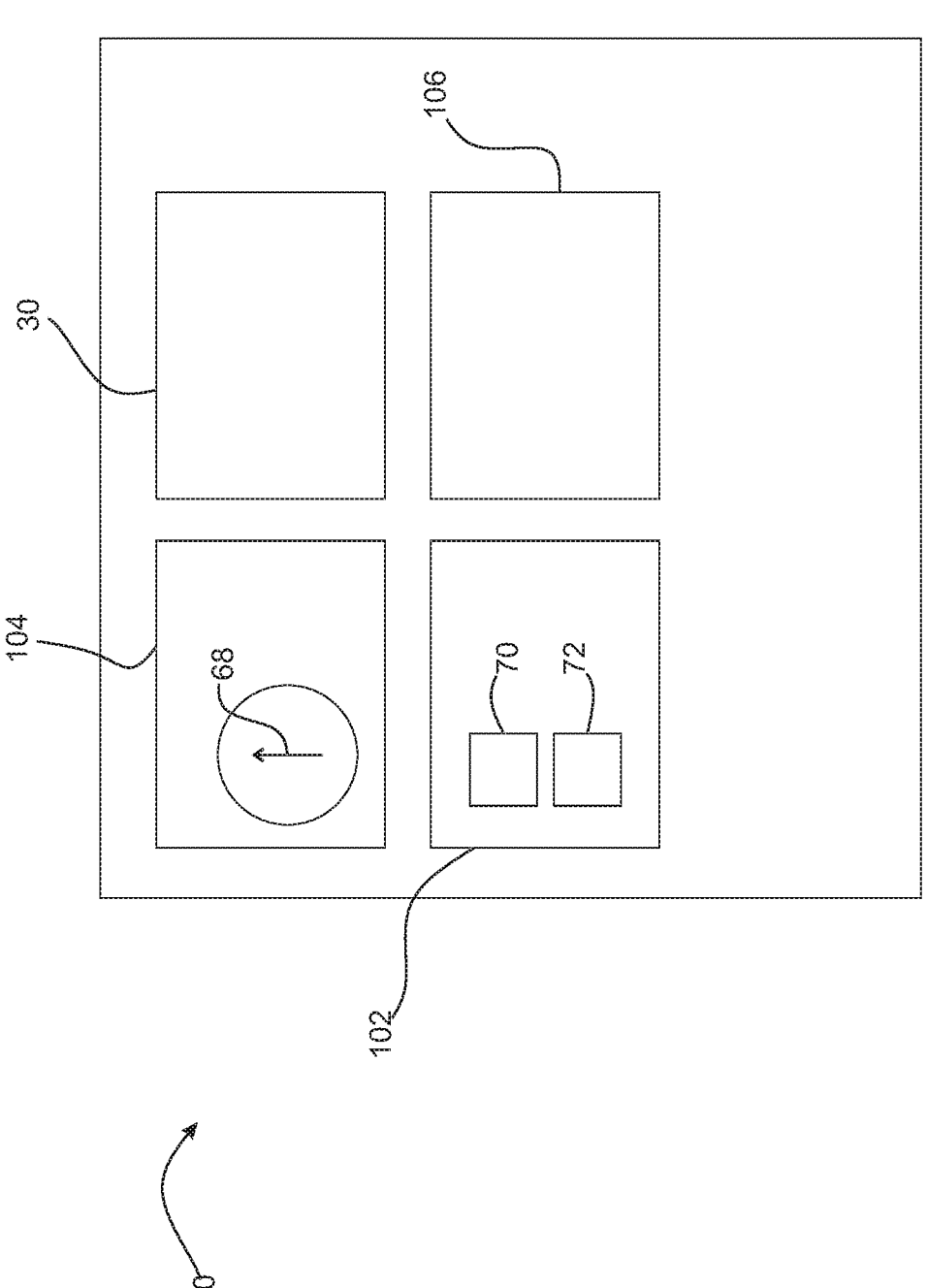
FIG. 14 provides various views of a system according to a preferred embodiment of the present invention.
Figure 15:
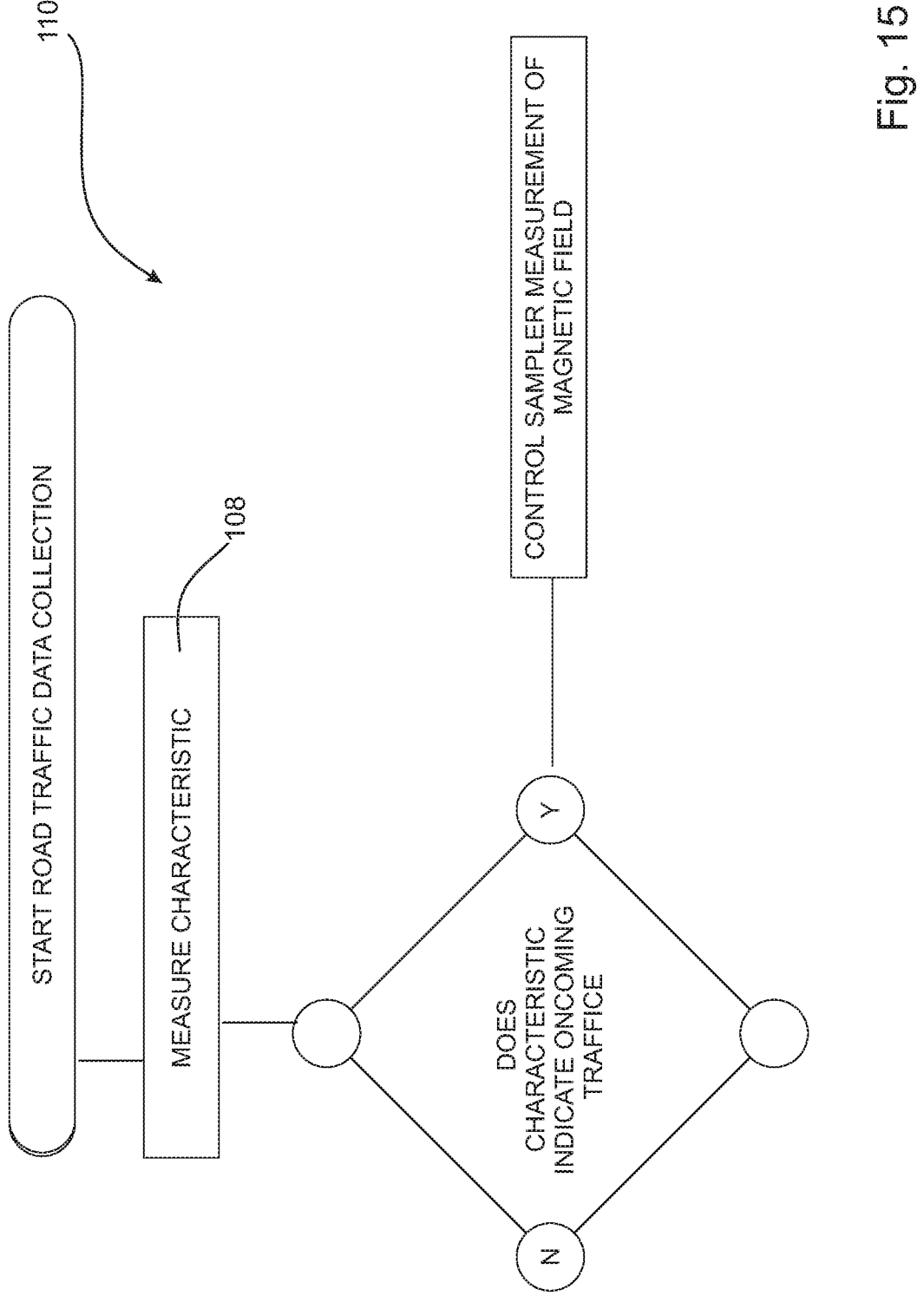
FIG. 15 provides various views of a method according to a preferred embodiment of the present invention.
Figure 16:
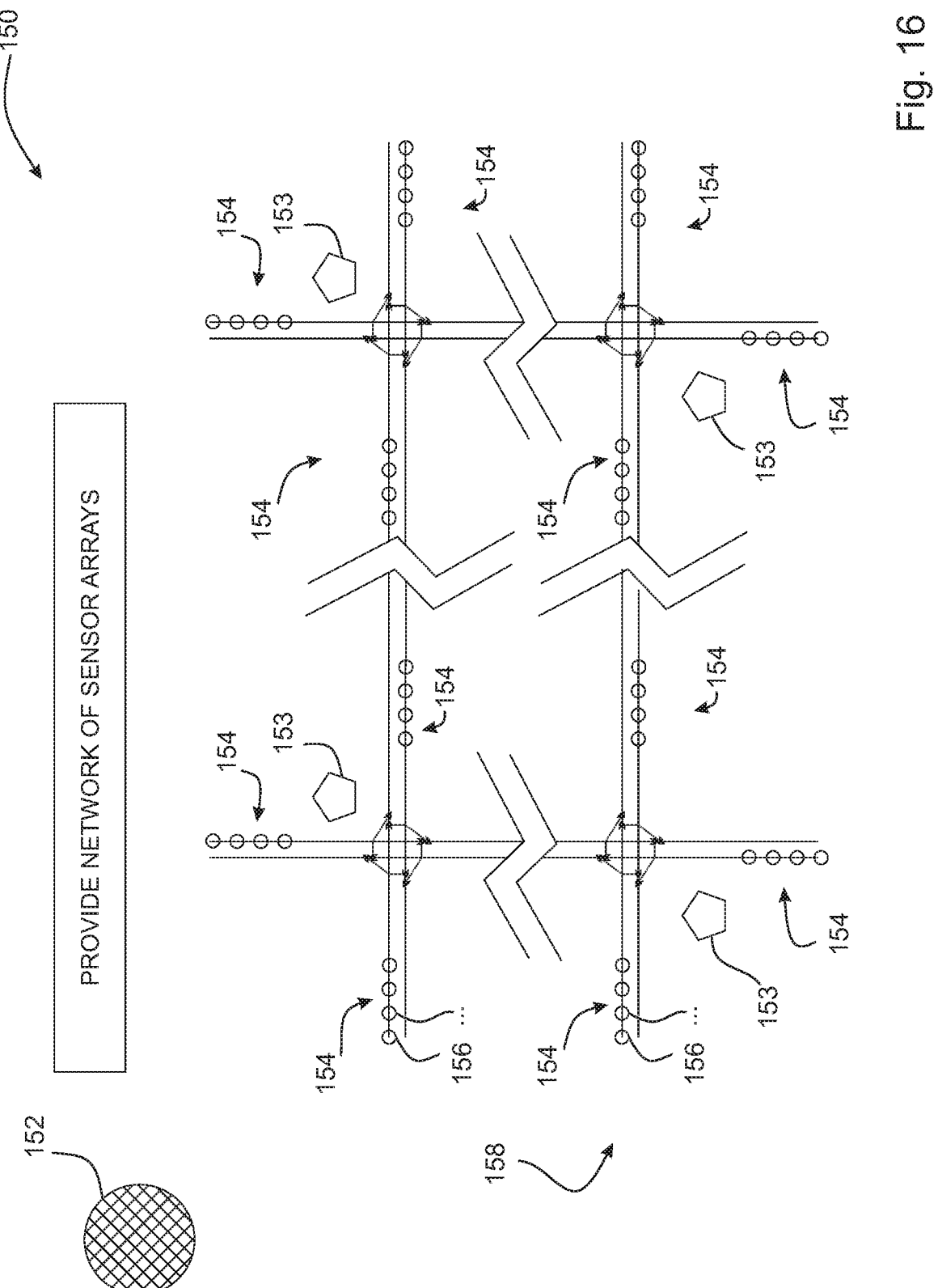
FIGS. 16 to 18 provide various views of a method according to a preferred embodiment of the present invention.
Figure 17:
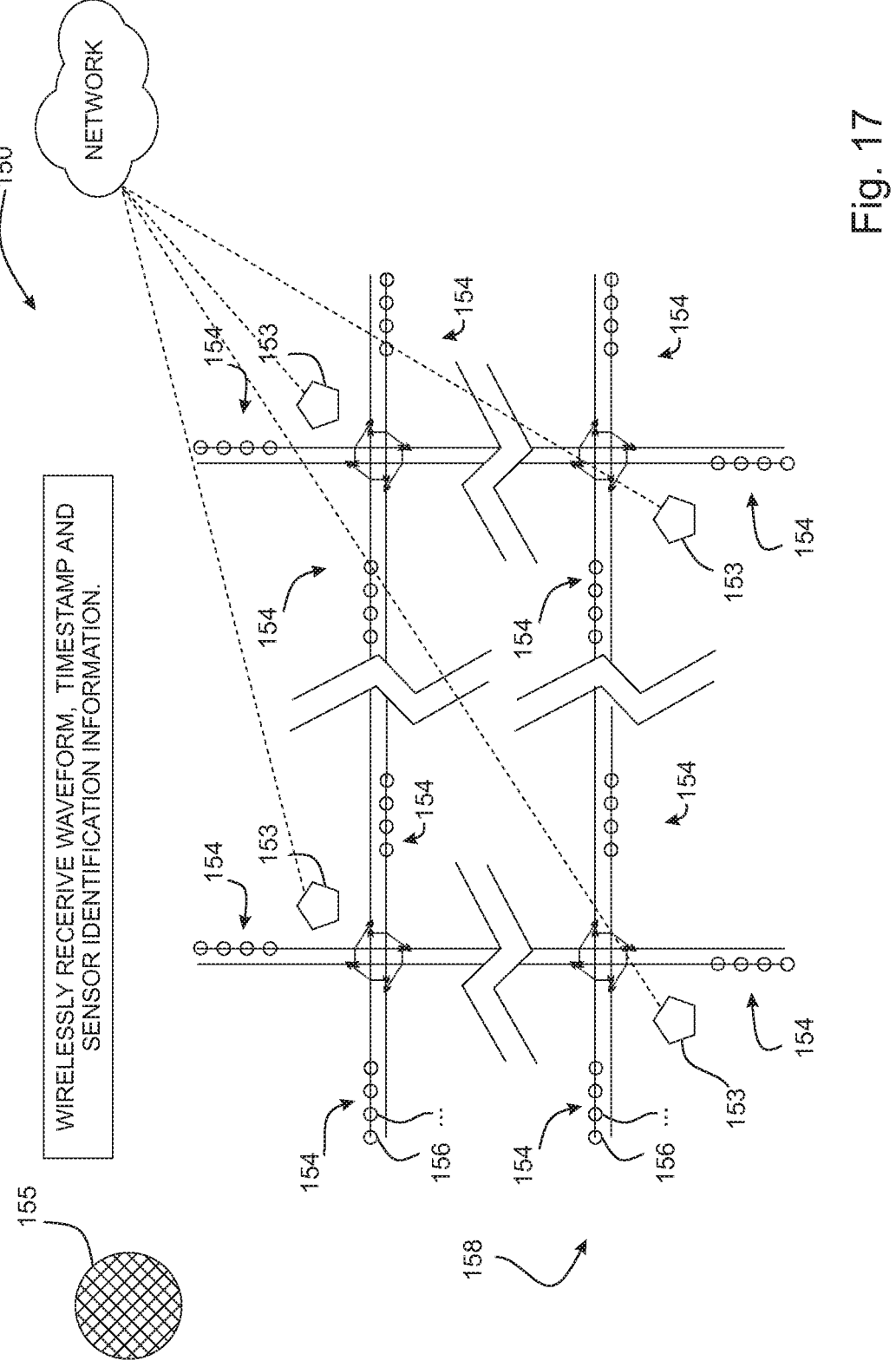
Figure 18:
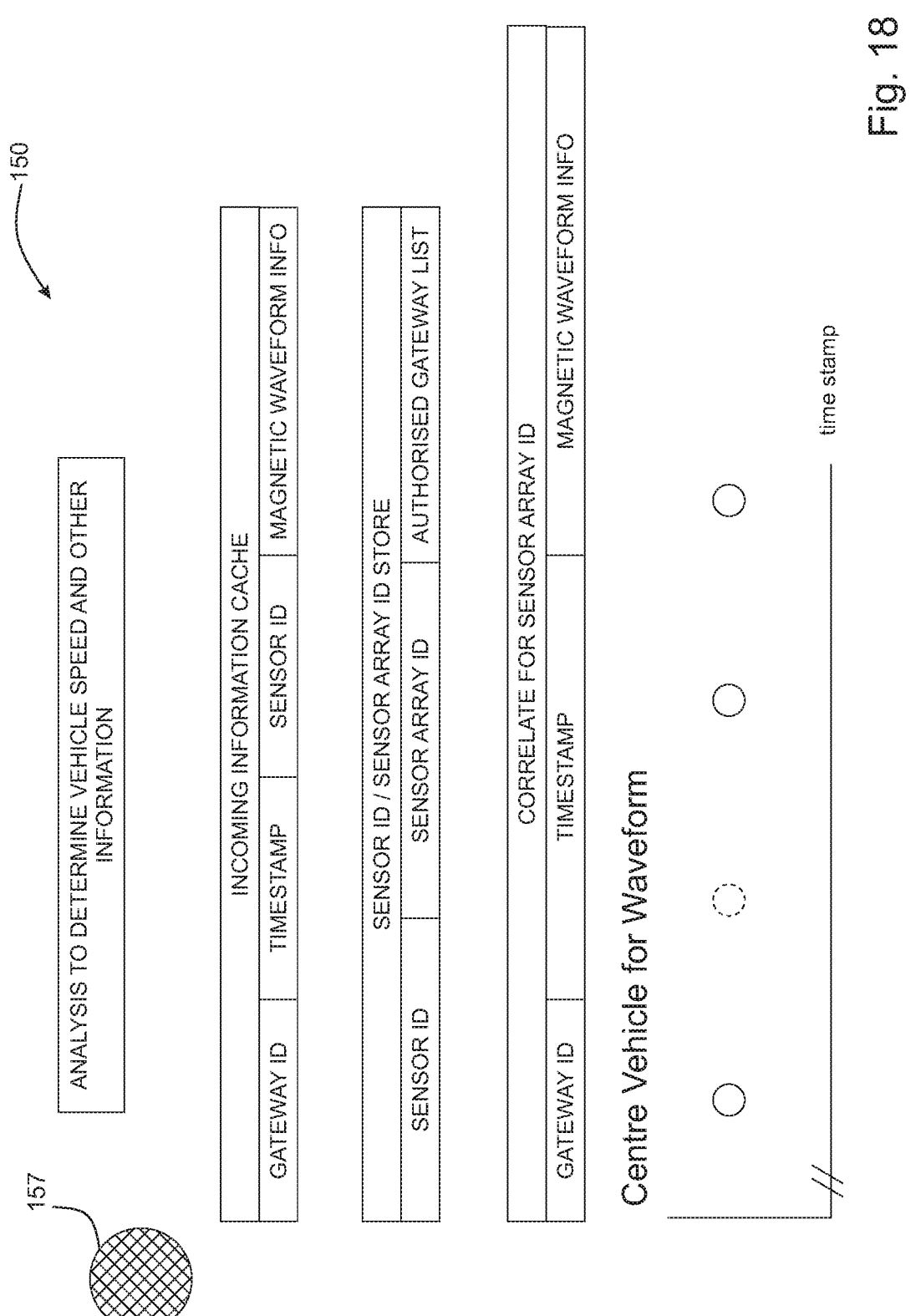
Figure 20:
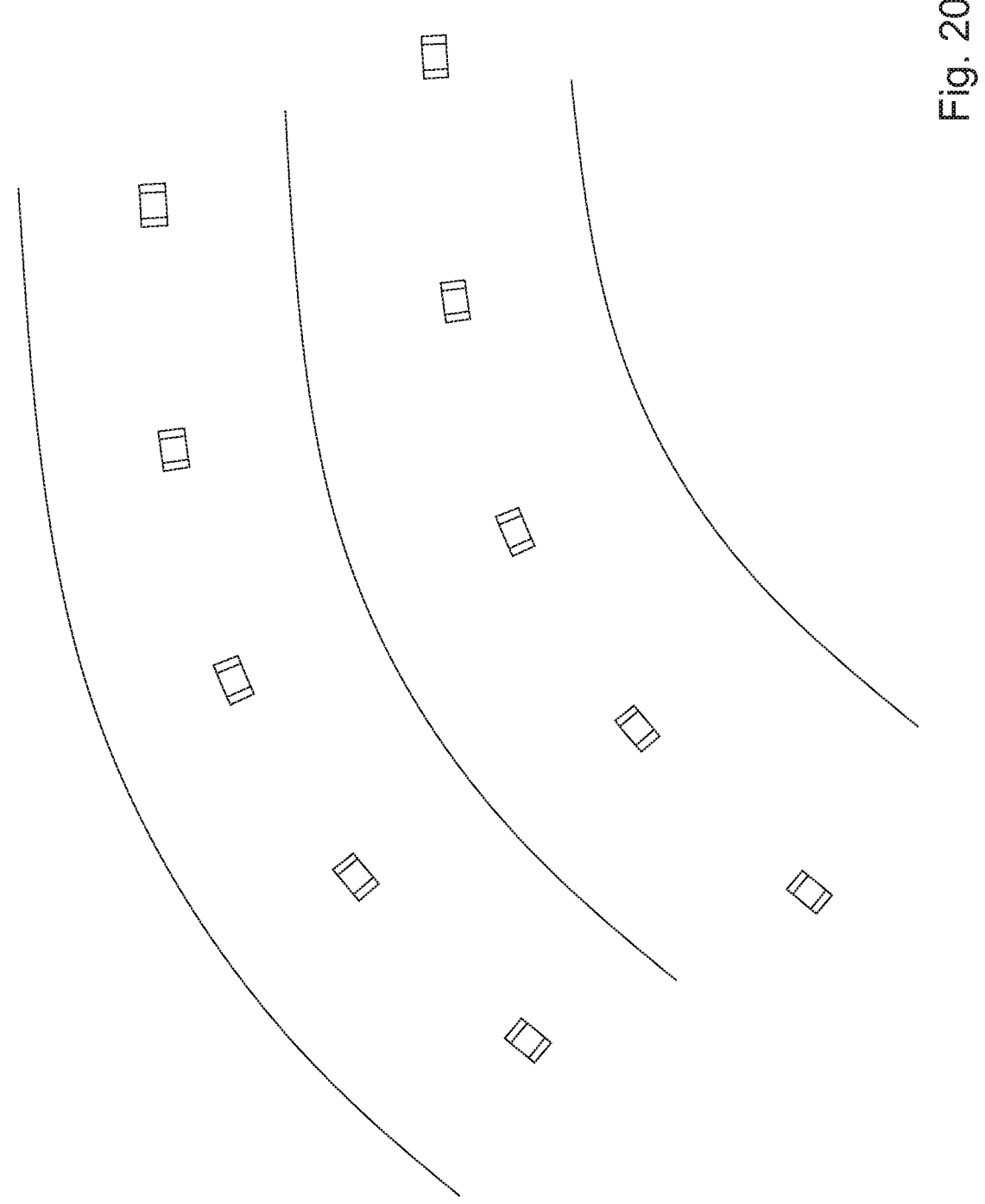
FIG. 20 shows placement of two road-based traffic arrays each extending along a double lane road.

The road-based traffic sensor 10 includes a body 12 having a base 14 and an upper portion 16. In the embodiment, the upper portion 16 includes opposing side ramps 17, an up ramp 18 and a down ramp 20. The up ramp 18 and the down ramp 20 are oppositely inclined. The base 14 provides a lower surface 21 with the internal part of the upper portion 16 being filled with a rigid filler to provide the lower surface (See FIG. 3). The lower surface 21 is configured for being adhesively secured to the upper surface of the road, when the sensor 10 is used, without needing to damage the upper surface of the road.

The body 12 houses electronic components 22 including a magnetometer 24, a battery 26, a solar cell 28 and a wireless transmitter 30. The magnetometer 24 is provided for monitoring changes in magnetic field caused by passing vehicles. The wireless transmitter 30 is provided for sending information from data collected by the magnetometer 24 to a central server for traffic analysis. The traffic sensor is configured to send magnetometer information and a sensor identifier. In the embodiment a timestamp and gateway identifier are added by an intermediary sensor gateway.

Advantageously, the body 12 has a slim line configuration 35 and is able to support heavy vehicles travelling at speed. Vehicles could be travelling at a speed of 120 km/hr or more and weigh over 1 tonne.

The slim line configuration 35 provides the body 12 with a height 37 no more than 25 mm and houses the electronic components 22. The base 14 of the body 12 is provided for being adhesively secured to the upper surface 32 of a road 34 with negligible damage to the upper surface 32. Installation may take a few minutes using a heatable adhesive pad.

In the context of the specification negligible damage embraces scouring into the top of the upper surface by a few millimetres as is done with some pavement markers. Such scouring is seen not to considerably damage the integrity of the road surface in terms of longevity. In this embodiment no scouring is performed when affixing the sensor 10 use an adhesive including hot glue or a meltable pad. No damage is made to the upper surface 32 of the road. Regardless the body is configured for being adhesively secured to the upper surface of the road without requiring any damage to the upper surface.

The road-based traffic sensor 10 functions as a wireless sensor that reports on vehicular traffic, road surface temperature, and mechanical vibration levels in the immediate vicinity of the sensor when fixed to a road surface. The sensor is intended to be rapidly installable (no more than a few minutes) and have negligible impact on a bituminous or concrete road surface through a non-destructive installation and removal process utilising either permanent or semi-permanent adhesives such as butyl adhesive pads.

The electronic components 22 are arranged in a layered structure 36. The layered structure 36 includes a first layer 38 comprising the solar cell 28; and a further layer 40 comprising the remaining electronic components and battery 26. The further layer 40 comprises all the electronics 46 of the electronic components excluding the solar cell 28. The electronics 46 are provided as a printed circuit board with the circuitry and the battery 26.

In the embodiment, the first layer 38, and the further layer 40 are each advantageously less than 0.8 mm in height.

As shown, the solar cell 28, electronics 46 and battery 26 are each of a slim line configuration in the layered structure 36 in that each is narrower than their width and breadth. As described the slim line configuration 35 provides the body 12 with a height of 25 mm and houses the electronic components 22.

The body 12 resembles a rigid pavement marker having a square frustrum shape providing the side ramps 17, the up ramp 18 and the down ramp 20. The road-based traffic sensor 10 is self-recharging using the solar cell 28, battery 26 and the sun. The road-based traffic sensor 10 is able to advantageously relay information collected over an extended period.

In other preferred embodiments, the slim line configuration 35 provides the body 12 with a height no more than 20 mm and houses the electronic components 22. In yet other embodiments there is no up ramp 18 and a down ramp 20. Rather, the upper portion 16 comprises a thin raised housing for electronic components 22.

The layered structure 36 includes a number of cushioning layers 48. Each cushioning layer 48 advantageously has elastomeric properties for distributing force over the layers of the electronic components 22 in the layered structure 36.

The cushioning layers 48 are configured to protect the electronic components 22 from mechanical stress caused by mechanical shock waves, shear forces and thermal expansion associated with common road traffic environments. In the present embodiment, the cushioning layers 48 each have a shore hardness between A10 to A20.

In the embodiment a cushioning surround 50 surrounds the electronic components 22 for dispersing and absorbing mechanical shock waves. The cushioning surround comprises a block of elastomeric material encasing the electronic components 22.

A central portion 54 is provided between the up ramp 18 and the down ramp 20. The central portion 54 includes side walls 55 and is provided for housing the layered structure 36.

The body 12 includes rigid reinforcing portions extending from the sides 56 of the body 12 to the side walls 55 of central portion 54 for providing rigidity to the slim line configuration 35.

The cushioning surround 50 immediately contacts the rigid plastic of the body 12 providing the upper portion 16. The body 12 includes the base 14 and provides a rigid housing 58 housing the layered structure 36. A rigid filler fills the remaining internal cavities 60 of the body 12 to provide the road-based traffic sensor 10.

The battery 26 when fully charged provides for at least 75 days of use of the road-based traffic sensor 10 with moderate traffic without solar recharging. In other words, the road-based traffic sensor 10 is able to function for at least 2.5 months with no solar recharging.

In sunny conditions, from a couple of hours prior to midday to a couple of hours after, the solar cell 24 can put 12 hours' worth of runtime energy into the battery 26 in an hour or less.

In the embodiment the body has a three-dimensional size of about 100 mm by 80 mm by 21 mm in three dimensions. Various arrangements are of course possible including much thinner bodies without ramps.

The road-based traffic sensor 10 includes a sampler 64 that is configured for sampling changes in the local magnetic field 68 caused by a vehicle 65 moving over the sensor 10. The sampler 64 is configured to selectively activate the magnetometer 24 and use the sampled magnetic field to control the sampling frequency.

More particularly the sampler 64 is configured to monitor the magnetic field 68 by activating the magnetometer and sampling according to a first frequency regime 70. If the magnetic field is sampled and is seen to indicate vehicle travel the sampler 64 advantageously changes the sampling to a higher frequency regime 72. In this manner it is possible to sample at a much higher frequency whilst not overly affecting battery life.

When the vehicle 65 travels over the sensor 10, the local magnetic field that might be experienced could follow waveform 74, for example. On sensing a perturbation in the magnetic field, the sampler 64 would switch from a first sampling frequency 76 to a second higher sampling frequency 78 and then back to the first sampling frequency 76. Switching back to the first sampling frequency 76 may occur once the magnetic field appears to have stabilised.

Magnetometer information generated using the sampled magnetometer waveform is measured and sent by the road traffic sensor 10 to a sensor gateway along with a sensor identifier. The sensor gateway sends the sensor identifier, the magnetometer information and a timestamp to an external server for processing. In this embodiment this occurs in near real time.

According to a second specific embodiment of the present invention there is provided a road traffic sensor 100. The road traffic sensor 100 includes a sampler 102, a magnetometer 104 and a vibration sensor 106. The sampler 102 is provided for sampling changes in magnetic field by activating and sampling the output of the magnetometer 104.

Advantageously the sampler is further configured for sampling changes in vibration levels by activating and sampling the output of the vibration sensor 106. Furthermore, the sampler 106 is configured to advantageously control sampling of the magnetometer 104 in response to vibration levels measured using the vibration sensor 106. This is considered to be advantageous for the reason that it should be possible for the sampler to change to a higher frequency regime well before a magnetic field perturbation would be sensed. In both embodiments the sampler uses a measured characteristic 108 to control the sampling and activation of the magnetometer.

In the second embodiment a measured characteristic 106 is advantageously used to provide early warning of nearby vehicular traffic and increases magnetic field sampling in response thereto. The magnetic field sampling occurs at a first frequency. When the measured characteristic indicates oncoming traffic, the frequency is advantageously increased by a factor of 2. In this manner there is provided a method 110 of road traffic data collection.

The road-based traffic sensor 10 is configured to wirelessly send time-stamped magnetometer field information along with a sensor identifier. The sensor 10 is able to be used to provide vehicle speed information by forming part of a sensor array comprising a series of road sensors 10' that extend along a second of road. Notably, the sensor 10 is configured to be effectively agnostic of its placement in a sensor array, even when used for determining traffic flow, vehicle speed or other characteristics.

In another embodiment there is provided a road-based traffic sensor comprising: a low power microcontroller such as Microchip SAM; tri-axis magnetometer; ISM band (866 MHz, 920 MHz) radio; solar charging battery management device; and Ultra low power DC-to-DC converter.

The sensor is advantageously able to measure pseudo road temperature using an inbuilt thermometer. In the embodiment the temperature measured is the temperature of magnetometer component, which should be at the temperature of the potting compound surrounding the magnetometer, which will be the temperature of the device surrounds but likely with a hysteresis effect due to the combined effects of the potting materials heat capacity and its thermal conductivity).

The sensor is installable directly onto a road surface, with the external form and appearance typical of a raised pavement marker within the road lane. Communication is via ISM (915 MHz) or SRD (868 MHz) band radio with a gateway device installed within the general vicinity of the sensor, utilising the gateway device to forward messages to services operating in an online environment, and utilising the gateway device as an accurate time source.

The housed componentry of one embodiment comprises: a solar panel (OCV between 3V and 5V) of approximate dimensions 75 mm×29 mm×1.5 mm; printed circuit board of approximate dimensions 40 mm×28 mm×3 mm (including heights of components); 3.2V 500 mAh Lithium Iron Phosphate (LiFePO4) battery of approximate dimensions 35 mm×25 mm×7 mm; piezo film or diaphragm style vibration transducer less than 25 mm×25 mm; and Low-current (<=1 mm diameter) insulated wire as required to connect battery and solar panel to circuit.

The battery and solar panel combination is intended to provide sufficient capacity to keep the device running perpetually (until component fatigue leads to device malfunction or failure to function). In this embodiment approximately 90 days (around 2200 hours) on full battery charge with no sunlight for that duration is provided. In sunny climes, such as Perth, Australia in the summer-time, under direct sunlight, the battery would take around 3 days to fully recharge (maximum charge current is around 50 mA).

The tri-axis magnetometer having arbitrary oriented X, Y and Z axes, is used to measure fluctuations in the vector direction and magnitude of the local magnetic field caused by the movement of vehicles, and from those fluctuations detect the presence, approximate heading and generate a gross identifier of vehicles in the immediate vicinity of the device.

The piezo vibration transducer is used to provide early-warning of nearby vehicular traffic such that higher-sampling-rate modes of the magnetic sensor can be pre-triggered. The vibration transducer is also utilised to provide a relative measure of the vibration levels experienced by the nearby road surface, which is reported to the online services for dissemination to road management authorities and thus providing additional data for estimating remaining lifetime of nearby road surfaces. The ISM/SRD radio device provides for ultra-low power communication with a gateway device in the general vicinity.

The housing comprises an outer shell constructed from a hard, tough, optically clear and UV stable plastic, which in the present embodiment is Polycarbonate. Whilst Polycarbonate is preferred, in other embodiments MABS (Methyl Methacrylate Acrylonitrile Butadiene Styrene) is used.

The topmost portion of the outer shell (above the centre cavity) is 4 mm thick, the outer side and sloping walls are 3 mm thick, and the inner struts are 2 mm thick. Outer shell outer maximum dimensions are 100 mm×80 mm×21 mm with the central cavity being 76 mm×30 mm×17 mm.

Adhesion of the lower surface 21 of the base 16 to the road surface is achieved using "butyl pads", which are heated to melting point with a torch, cool very quickly and bond virtually instantaneously. The predominate installation time is heating the road surface and the butyl pad to the required temperature which is typically within 60 seconds.

The electronic components 22 are housed within the centre cavity of the outer housing and are each embedded within (and separated by) a layer of very soft (shore hardness A10 to A20), optically clear and UV stable, polyurethane compound such as Electrolube UR5048. The remaining cavities within the outer housing are then filled with a very hard, very strong, opaque epoxy such as MG Chemicals MG-832HT.

The hard, strong and opaque epoxy provides the compressive and tensile strength to ensure the housing is considered not to significantly compress or fracture from the mechanical force generated by vehicle tyres (standard cars, trucks and buses) impacting the device whether at low speed, high speed or whilst a vehicle tyre has temporarily come to rest directly on the device. The inner soft polyurethane compound protects the sensitive electronic components), via dispersion and absorption (energy stored in compressed and/or distorted material lattice as per known behaviour of elastomers).

The solar panel is mounted closest to the top of the outer housing, with the circuit board and battery mounted side-by-side below the solar panel. The thickness of the soft polyurethane layer between the outer shell and the solar panel in some embodiments is approximately 0.2 mm to 0.6 mm. The thickness of the soft polyurethane layer between the solar panel and the circuit board, mounted with components facing the base of the device, in some embodiments is approximately 0.8 mm to 1 mm. The thickness of the soft polyurethane layer between the solar panel and the battery in some embodiments ranges from 0.2 mm to 1 mm. The thickness of the layer of soft polyurethane on the component-side of the circuit board is at least 2.5 mm and can be as thick as 5 mm. The thickness of the soft polyurethane below the battery is from 0.5 mm to 1 mm.

The battery and PCB are side-by-side, below the solar panel and separated from the solar panel by approx. 1 mm of the soft elastomeric compound. The closest space between the battery and PCB is around 0.5 mm to 1 mm, and is again filled with the elastomeric compound. That battery has only a thin 0.5 mm layer of elastomeric compound between it and the hard epoxy that fills the remaining space to the base of the sensor. The bottom-facing side of the PCB, which contains the electronic components, has a thicker layer of elastomeric compound (at least 2.5 mm, up to 5 mm), as that area is the most sensitive to mechanical stresses (which can also be generated by thermal expansion).

As discussed, the housing protects the electronics from the mechanical shock of tyres impacting the stud. In this embodiment, this has been achieved by a layout combined with use of multiple-potting compounds, with a soft & flexible compound (such as Electrolube UR5048) directly surrounding the electronics that disperses and absorbs mechanical shock waves (and thus reduces the chances of physical destruction of the PCB and components). The outer layer of potting compound provides rigidity to resist static compression (as opposed to shock waves which will propagate very well through such materials) and flexural forces (resist rupture and bending). The soft inner compound is designed to reduce the magnitude of those shock waves propagating through the hard outer encapsulant.

In the present embodiment, the layered structure previously described is provided in rectangular form.

In other embodiments the housing is replaced by a ramped rubber mat in a similar shape to the shape of the described outer shell/housing.

The magnetometer information sent by the sensor, in various embodiments, does not include the full waveform. Rather the sensor is configured to send various characteristics derived from the full magnetometer waveform including a reference point and a signature. The information sent in one embodiment includes: sensor identifier; activity start timestamp; activity stop timestamp; indicator—was field in perturbed-from-rest state before activity started; indicator—is field still in perturbed-from-rest after activity stopped; and estimated centre of mass reference point.

One approach being considered comprises a computing an ensemble weighted-average index into the full waveform (weighting given via sample magnitude at each index) and computing the timestamp at that index. This can be considered as analogous to computing the centre of mass of a rigid body.

Including a waveform signature is also possible. One approach being considered comprises a DCT-II transform of the first 128 samples (zero padded if waveform not long enough) from the first peak or trough found in the waveform, and generating a small vector by combining the first 4 to 12 coefficients of the transform, after magnitude compression.

In a further embodiment there is provided a slim line configuration comprising a reinforced body and electronics component that advantageously requires no physical damage the upper road surface. The electronics component comprises a magnetometer, solar cell and battery where the component comprises a module that is inserted into a portion of the reinforced body; the reinforced body comprising a base and two ramp portions supporting greater than 1 tonne vehicle traffic; the base being configured for being adhesively secured to the upper road surface; and the battery being of a height no more than 10 mm.

Advantages of the device include providing for measurement without damaging the road surface in the road traffic industry where extended measurement times are particularly important, and which can accommodate heavy traffic including 1+ tonne vehicles.

According to a further embodiment there is provided a method of road traffic data collection 150. At block 152, the method 150 includes providing sensor arrays 154 of surface mounted wireless sensors 156 on a road network 158 near a number of intersections with at least some of the arrays 154 each comprising three or more surface mounted wireless sensors 156 spaced along a corresponding section of road. In the embodiment four sensors 156 are placed in each array 156 in the middle of a lane in various double lane roads. The sensors 156 in each array 154 communicate with an adjacent sensor gateway 153.

At block 155, the method 150 includes receiving information from the sensors 156. The information includes magnetometer information, sensor identification and timestamp information.

At block 157, the method 150 includes analysing received information to determine vehicle speed and other information. At block 157, the analysis includes compensating for surface mounted wireless road-based sensors having become separated from the road or otherwise malfunctioning. In this regard it is to be appreciated that a malfunctioning sensor 156 may be a relatively unlikely event in comparison to a sensor having become separated from the road due to the adhesive nature of the fixing of the sensor to the road surface without digging.

The method 150 maintains an incoming information cache, where the magnetic waveform information is provided along with a sensor identifier, timestamp and gateway identifier. In order to determine the corresponding sensor arrays, the method 150 looks up a sensor identifier and sensory array store. This allows the analysis to be based on gateway id, timestamp and magnetic waveform information for each sensor array. The analysis involves identifying vehicles and ordered adjusted timestamps for an array. Where adjusted timestamps do not meet criteria and indicate that a sensor has been removed from the road surface, the system adjusts for this to best estimate vehicle speed from the remaining adjusted timestamps. Various correlation approaches may be applied to identify vehicles and missing expected sensor measurements.

The provision of arrays 154 of three or more surface mounted wireless sensors 156 spaced along a road is considered to provide significant advantages in the method 150. Firstly, it is possible to determine information regarding speed from pairs of functioning sensors in each array. In an array with n functioning sensors there will be $n(n-1)/2$ pairs each providing a measurement. In the embodiment the sensors in an array, as installed, each have a set spacing from each adjacent sensor in the series. The method 150 has a set spacing of 5 m.

In one embodiment the functioning of the analyser is as follows. The analyser collects information from a sensor with sensor identifier. The analyser waits for a set time period 166. At block 168, the analyser determines all sensors in the sensor array corresponding with the sensor identifier.

After the time period has elapsed, the analyser determines whether any measurements have been received from the sensors that indicate that a sensor has been removed from the road surface.

This is generally achieved by analysing for multiples of a set time separation between measurements when a vehicle is seen to pass over the sensor array. The method also advantageously will account for acceleration by looking for increasing time separations between measurements. If a time separation is significantly more than expected, then this indicates removal of a sensor from the road surface.

The analysis determines speed of vehicle travel from the measurements based on a set separation of spaced apart sensors in the array. The information is analysed to determine spurious measurements and account for known adjustments in five metres between the sensors in the set distance between particular sensors. Advantageously over time, the system is configured to characterise the variations in the separation between sensors. Notably in another embodiment the separations between the sensors are recorded otherwise and determined using GPS information sent by the sensors. In the present embodiment, providing each sensor with GPS is not preferred. In other embodiments, it is.

By having arrays of nodes each having at least 3 sensors accuracy should be able to be increased due to there being $n(n-1)/2$ pairs of sensors in each array of n functioning sensors from which a speed measurement can be determined.

According to a further preferred embodiment of the present invention there is provided a system 200. The system 200 includes sensor arrays 202 of surface mounted wireless road-based sensors 204 positioned in road network 206 with at least some of the sensor arrays 202 each comprising at least three surface mounted wireless road-based sensors 204 spaced along a corresponding section of road. The system includes an online server facility 205 including receiver 208 for receiving information from the sensors 204 and an analyser 210 for analysing received information to determine vehicle speed information. The analyser 210 is configured to compensate for surface mounted wireless road-based sensors having become separated from the road or otherwise malfunctioning.

The functioning of the system 200 accords with method 150. As with the method 150, each sensor 202 effectively sends magnetometer waveform information and sensor identification with a timestamp. Each sensor is effectively agnostic of its placement in a corresponding sensor array known by the analyser 210. The analysis is performed with the analyser 210 being provided in an online system separate from the sensors 204.

The system 200 includes a number of gateways 214 in communication with the sensors 204 of each sensor array 202. The sensors 204 in each sensor array 202 send magnetometer information to sensor gateways 214, with the sensor gateways 214 being agnostic of placement of the sensors 204. The online system 205 and analyser 210 are separate from the sensor gateways 214 and the sensors 204.

The analyser 210 is configured to and analyses the received information using combinations of sensor measurements in each array to improve accuracy. As before the analysis accounts for incorrect set physical spacings on the corresponding section of road between the sensors in each array.

The analysis is performed on a real time basis with the analysing being ideally performed within less than 5 minutes after the sensors send the information to provide the traffic related information (vehicle speed related information).

The system includes a notifier 216 that proactively issues alerts 218 to limit the number of surface mounted wireless road-based sensors that are separated from the road or otherwise malfunctioning. This is considered to be advantageous for the reason that maintenance providers (who are responsible for certain sections of road) can be notified of surface mounted sensors having been separated from the road surface (or are malfunctioning).

Furthermore, in one embodiment, speed related information is maintained by the notifier 216 proactively issuing urgent alerts 220 when a sensor array approaches a single functioning surface mounted wireless road-based sensor due to surface mounted wireless road-based sensors in the corresponding array having become separated from the road (or are malfunctioning).

The system 200 advantageously uses the road-based traffic sensor 10 for each of the wireless road-based sensors 204. Unlike conventional road traffic sensors systems, the use of the road-based traffic sensor means that installation, maintenance and replacement of sensor nodes is relatively straightforward using an adhesive heatable pad and does not requires digging and repair to the road surface.

In one related embodiment, the sensors are surface mounted and arranged as redundant arrays of devices within a lane. As sensors become separated from the road over time, the system is able to advantageously operate with a built-in level of redundancy. Physical sensors are agnostic of their own placement and adjacent peers; gateways are agnostic of sensor placements and physical road lanes; no processing is performed at the sensor or gateway level; sensor array configuration and processing is solely applied in a cloud-based environment.

One mapping approach according to an embodiment involves mapping the data produced by individual sensors into a virtual device array. More particularly the approach involves ingesting individual sensor data, analysing each sensor timeseries with other each sensor timeseries with other sensors of the same array lane to produce individual counts, speeds and classifications. The algorithm employed detects and compensates for missing sensors during correlation on the fly to provide the following operating modes:

- - -

Healthy, Redundant: All devices active.
No failures detected.

- - -

Degraded, Redundant: At least 3 Sensors active, devices missing
One or several sensors have failed, however enough devices are operating to provide redundancy.

- - -

Degraded, Active: 2 Sensors
All but two sensors have failed. The Array continues to operate normally but is however no longer redundant. Further Sensor failure(s) will impact the Array.

- - -

Degraded, Error: 1 Sensor
The Array is no longer able to operate with high accuracy, the data produced is now limited to Count.

- - -

Failed: All Sensors missing
No Live data can now be acquired.

- - -

The reporting of degraded status enables the repair/reinstatement of any sensor prior to any loss of volume, speed or classification/length data.

In yet another embodiment of the present invention there is provided a method of adding one or more sensors to a road network comprising: providing arrays of surface mounted wireless sensors on a road network; with respect to each array, physically separating sensors in a predetermined manner along the section of road associated with the array; receiving information from the sensors; and analysing the received information to associate added sensors with arrays; the added sensors having been added to replace sensors that have become separated from the road or are otherwise malfunctioning.

The method is considered to be advantageous for the reason that an added sensor does not have to be manually associated with an array by the installer. The installer merely places a new sensor in position relative to an existing array and the system correlates measurements to associate the added sensor with the existing array. If all the sensors of an array are removed from the road surface, then there will not be any measurements to analyse against. For this reason, there must be at least one existing and functioning sensor of an array in position on the road surface. Otherwise an array will have to be manually added with a position on the road network being manually specified.

The analysis includes monitoring measurements to determine whether added sensors that are not associated with an array provide measurements associated with times indicating that they should be associated with an array. One particular embodiment has the limitation that within each array, the nodes are separated by a predetermined distance.

Another embodiment comprises a road traffic analysis system including: arrays of surface mounted wireless sensors for being positioned in a road network with, in each array, the sensors being physically separated in a predetermined manner along the section of road associated with the array; a receiver for receiving information from the sensors; and a analyser for analysing the received information to associate added sensors with arrays; the added sensors having been added to replace sensors that have become separated from the road for analysing the received information to associate added sensors with arrays; the added sensors having been added to replace sensors that have become separated from the road or are otherwise malfunctioning.

The analyser is configured to monitor measurements to determine whether unallocated sensors provide measurements associated with times indicating that they should be associated with an array.

In the systems and methods, a sensor device engages a communication process to automatically be associated with a communications gateway. The association with a communications gateway utilises a signal strength approach, selecting a gateway with good a communication signal. The sensor is ideally associated with more than one gateway with one being a main gateway and the others being secondary reserve gateways. Advantageously, the system is configured to allocate an array to the sensor automatically using a correlation approach. This is considered to be advantageous for the reason that as some of the sensors are knocked off their position in the road and/or removed from the site, the process for adding a replacement sensor becomes one involving simply fixing a replacement sensor without associating an array with the sensor identifier in the online system.

The analysis involves the system determining patterns of measurement that indicate that a sensor has been added. The indication includes monitoring for consistent measurements that accord with expected measurement patterns associated with vehicle movement.

For example, if the system indicated that there is an array with two nodes—Sensor ID56846778489 and Sensor ID4649815687 and if unallocated Sensor ID5787638877 consistently provided measurements indicating that the nodes are separated in the predetermined manner with vehicles travelling over each of the sensors, unallocated Sensor ID5787638877 would be associated with the array.

Embodiments may also involve gateways adding a gateway identifier to sensor communications with the analyser to assist the analyser in excluding clearly unrelated sensors and/or unrelated arrays. to assist the analyser in excluding clearly unrelated sensors and/or unrelated arrays.

For security reasons, methods and systems may require sensor authentication in the system.

In one embodiment, an authorisation store is maintained for specific gateways. The authorisation store ensures that only specific sensors can "associate" with given gateway for communication with the main system.

In one embodiment the sensor needs a known-to-be-active "gateway" in order to operate. This occurs when a sensor; a) boots up, or b) if a gateway hasn't yet been found and a retry process is commences, or c) if a previously utilised gateway fails to respond for a sufficient period of time; then under any of (a), (b) or (c) the device scans a pre-determined set of radio channels (that are being utilised) and where one or more gateways responds, commences using the one with the strongest radio signal strength (as determined by responses to the channel scans). If no gateway responds, then the device goes into an offline ultra-low-power mode and keeps trying at a predefined schedule (per (b) above)

In other embodiments the operator has to specify which sensors belong to which array in the online system. The order of the sensors in an array being auto-determined.

In a third specific embodiment, the system is embodied in a telemetry system including base station units associated with an array of sensors, whereby these base-station units are based on a combination of custom and off-the-shelf hardware, running proprietary software within a Linux operating environment.

The base station units communicate with cloud services that are the fundamental destination for all sensor data. These services aggregate, historise and process sensor data to produce vehicle volume, speed and classification data.

This system is embodied to provide for the production of near real-time trend data, over custom intervals from minutes to hours, allowing clients to monitor traffic flows in near real-time.

The road-based sensors comprise cast-aluminium housings for improved robustness and traffic wearability that contain LED driving circuitry and more-sensitive and finer-pitch electronics.

To address a problem with the running signal median that fits the post-processed magnetometer data for removing the running median by rectifying and combining the 3 axes into a single data-stream, and which addresses vehicle perturbations of the Earth's geomagnetic field involved adopting an alternative housing to those described in the preceding embodiments.

Previously, a clear polycarbonate shell was packed with components and then potted with resins, leading to a (predominantly) RF-transparent housing. In the present embodiment, this is replaced with a cast aluminium housing that is not RF-transparent and thus requires a re-design of the antenna aspect of the system. Consequently, an ISM-band RF antenna is embedded into a resin filled cavity on the outer surface of a cast-aluminium housing to allow the RF signal to remain communicable within a 100 m range where that cavity has line-of-sight to the RF base-station device.

A PCB-type antenna is used to maintain an acceptable impedance, sufficient efficiency, lack of reflection-induced multipath fading, whereby the antenna is readily assembled into a particular cavity on the pre-determined cast-aluminium housing so that the system can communicate per target.

An algorithm for embodying enhanced magnetic data analysis is provided to optimally adopt effective sampling rates and provide a method of differentiating in-lane vehicles from neighbouring lane vehicles. This is achieved by examining the relative average power of the deltas of each of the X, Y and Z axes of the magnetometer. Assuming that the x-axis of the magnetometer is perpendicular to traffic flow, y-axis is parallel to traffic flow, and z-axis is vertically oriented.

From this, the relative fluctuations (deltas, relative to base-line) of each axis across the duration of a vehicles presence, will:

(a) cause fluctuations of only one sign (positive or negative) in the x-axis, (b) cause relatively weak fluctuations in the y-axis and (c) cause relatively weak fluctuations in the z-axis.

Data analysis indicates that in-lane vehicles cause strong y-axis and z-axis fluctuations and weak fluctuations for vehicles that do not directly pass over the magnetometer.

Consequently, thresholds are empirically determined through large-scale data analysis that provide a practical mechanism for making a strong statistically relevant prediction as to in-lane/out-of-lane status of a vehicle.

This methodology utilises the derivative of the signal of each magnetometer axis individually, as opposed to the prior methods that utilised the combined vector-norm from offset-cancelled axis signals.

It is noted that the x-axis and y-axis fluctuations are poorly correlated with the in-lane or out-of-lane status of detected vehicles. From this it can be determined that in-lane vehicles generate relatively strong z-axis fluctuations both above and below the mean of the z-axis signal, where-as out-of-lane traffic vehicles (when any signal perturbation is generated) perturb the z-axis signal only in one direction (either above or below the mean, dependent on sensor axis orientation and Earth's magnetic inclination at the installation site). Consequently, this methodology utilises tracking of the z-axis perturbations over the duration of a vehicle and accepting vehicles as in-lane only when both positively and negatively signed z-axis perturbations of sufficient amplitude are detected.

In a further embodiment, there is provided a vehicle record generation process including a low-processing-power/low-memory algorithm especially programmed to allow for moving the vehicle generation process/computation onto edge devices at the base-stations, such that final vehicle data (single timestamp, length, speed etc) is pushed to Cloud servers, as opposed to all of the individual events from multiple related sensors from which the vehicle records are generated. This has allowed costs to be reduced by reducing computation time and space requirements within the related Cloud services, and also allows for signage collocated with the installation to display vehicle information in true real-time.

Furthermore in other embodiments, raw vehicle lengths are computed from multiple related sensor events Accordingly, an algorithm is embodied for compensating the raw vehicle lengths adopting an iterative design process, resulting in corrected vehicle lengths that had acceptable variance in error from results of existing technologies.

In accordance with the present embodiment, the installation of a sensor constructed with an aluminium housing unit in an in-road arrangement as shown in FIG. 21 will now be described.

Moreover, as shown in FIG. 21a, the process commences with marking each sensor position in the centre of the traffic lane. Where speeds are ≤60 km/h, a spacing of 3 m is used between sensors. For speeds over 60 km/h, a spacing of 4 m is used. The lane is cleared of loose material to allow for proper bonding of the mounting pad.

As shown in FIG. 21b, the road surface is heated around where each sensor will be installed to 140° C./285° F. with a gas burner. The mounting pad is placed on the heated area as shown in FIG. 21c, ensuring correct spacings are maintained and each pad is aligned with the direction of the road.

As shown in FIG. 21d and FIG. 21e, the gas burner is used to heat the mounting pad to a final temperature of at least 240° C./465° F. When the pad is sufficiently heated it should have a viscous liquid appearance and may emit a small amount of smoke.

Figure 21F:
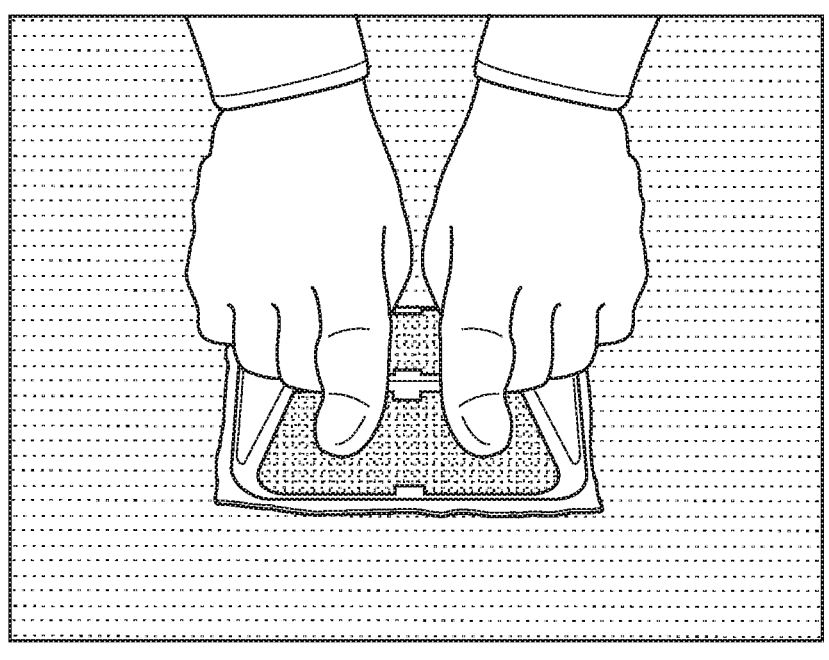
FIG. 21*f* shows placement of the sensor block onto the mounting pad for permanent adhesion thereto.

As shown in FIG. 21*f*, the sensor unit is placed onto the centre of the pad, leaving a small amount of pad protruding evenly around the edges. Pressure is applied on the stud by gently standing on it, ensuring alignment is maintained.

Figure 21G:
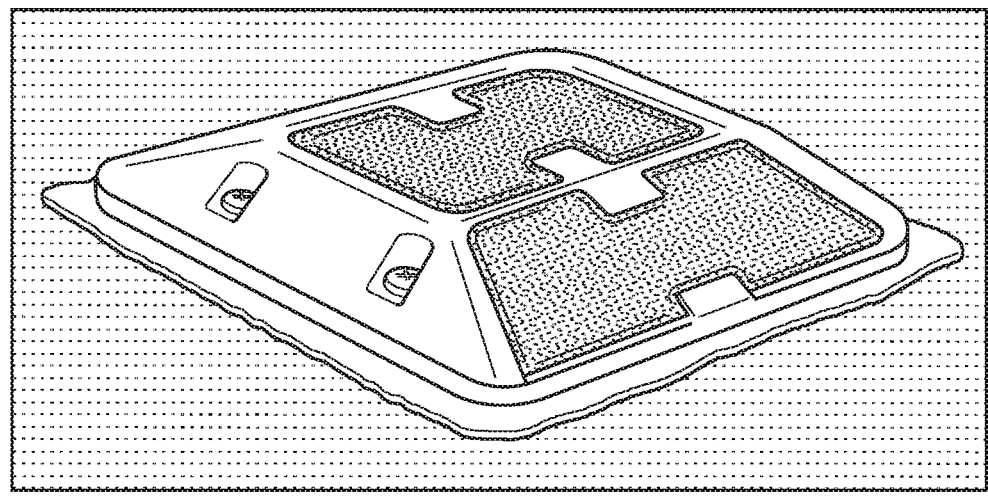
FIG. 21*g* shows a perspective view of in-road sensor provided with an aluminium housing.

FIG. 21*g* shows the resultant sensor unit in situ.

Whist each of the aforementioned embodiments described indicate the position of sensors that surmount the road surface with minimal damage or interference with the road surface, in colder climates that are subject to snowing and ice, where snow ploughs may be deployed to scrape the road surface to rid it from snow and ice, it is not feasible for the sensor unit to project above the road surface, otherwise it would interfere with he operation of the plough.

In these environments, the sensor unit is actually embedded into the road surface so that its upper surface is coplanar or marginally below the road surface. In these situations, having a minimum height for the sensor is critical, whereby the road needs to be gouged to form a small depression within which a sensor may be optimally disposed to fit within the recess formed within the road and avoid engagement with a snow plough or other road scraping machine.

With sufficient computing power, the applicant considers that it may be feasible in the future to auto-determine the sensor-to-array mapping (on top of the order within array). Such a system should definitely be possible for a relatively limited number of arrays, especially when the nearest gateway is selected based on signal strength and a gateway identifier is used as part of the correlation to associate added nodes with identifiers.

As would be apparent, each of the systems and methods comprise automated computer implemented systems and methods, in terms of the wireless communications and analysis. In various preferred embodiments the matching of measurements is based on a predetermined sensor spacing such as a 5 m spacing. Various matching (analysis) approaches to determine speed related and other information may be employed using n sensors in each sensor array.

As would be apparent, various alterations and equivalent forms may be provided without departing from the spirit and scope of the present invention. This includes modifications within the scope of the appended claims along with all modifications, alternative constructions and equivalents.

There is no intention to limit the present invention to the specific embodiments shown in the drawings. The present invention is to be construed beneficially to the applicant and the invention given its full scope.

In the present specification, the presence of particular features does not preclude the existence of further features. The words 'comprising', 'including', 'or' and 'having' are to be construed in an inclusive rather than an exclusive sense.

It is to be recognised that any discussion in the present specification is intended to explain the context of the present invention. It is not to be taken as an admission that the material discussed formed part of the prior art base or relevant general knowledge in any particular country or region.

The claims defining the invention are as follows:

1. A method of road traffic data collection comprising:
   providing arrays of two or more wireless sensors mounted-on, in, or at a surface of a road network, each sensor including a magnetometer configured to monitor changes in magnetic field;
   receiving magnetic field waveform data from information sent by the sensors;

analysing the magnetic field waveform data from each sensor by computing one or more characteristic values, indices, or signatures derived from the waveform, the analysis comprising at least one of: time-domain analysis, frequency-domain analysis, statistical analysis, or a transformation of the waveform data, wherein the characteristic values are used for event detection, classification, or sensor association;
   determining traffic information including vehicle volume or vehicle speed based on the analysed data; and
   compensating for sensors that have become separated from the road or are otherwise malfunctioning.

2. A method as claimed in claim 1, wherein the step of analysing received information includes configuring each sensor to be agnostic of its placement in the corresponding array.

3. A method as claimed in claim 1, including performing the analysing of the information separately of the sensors.

4. A method as claimed in claim 1, including the arrays sending magnetometer information to sensor gateways configured to be agnostic of the placement of the sensors.

5. A method as claimed in claim 1, including analysing the information separately from the sensor gateways and sensor.

6. A method as claimed in claim 1, including analysing the received information using combinations of sensor measurements in each array to improve accuracy.

7. A method as claimed in claim 6, including accounting for incorrect physical spacing measurements between the sensors in an array.

8. A method as claimed in claim 1, including proactively issuing alerts to report the number of sensors that are separated from the road or are otherwise malfunctioning.

9. A method as claimed in claim 1, comprising proactively issuing alerts when an array approaches a single functioning sensor enabling repair while the array continues to operate.

10. A method as claimed in claim 1, wherein the analysing includes monitoring measurements to determine whether added sensors provide measurements associated with times indicating that they should be associated with an array.

11. A method as claimed in claim 1, wherein sensors in each array are separated by predetermined distances, which may differ between individual sensor pairs, provided that the actual inter-sensor distances are known or determined for use in the analysing.

12. A method as claimed in claim 1, wherein each array comprises at least three sensors and the system is configured, upon malfunction of a sensor, to maintain at least two functioning sensors to provide redundancy, while issuing an alert for repair and continuing operation of the array.

13. A method as claimed in claim 1, further comprising automatically associating newly added sensors with existing arrays by correlating event timing or waveform-derived characteristics with those of sensors already in the array.

14. A method as claimed in claim 1, wherein the analysing includes generating a compact representation of each event comprising a reference point, a weighted-average index, or a signature vector obtained by applying a mathematical function or transformation to the waveform data, and using the compact representation for event detection, classification, or sensor association.

15. A method as claimed in claim 1, comprising, for each of the wireless sensors mounted on, in, or at the surface of the road network and configured to provide magnetometer-based traffic data, installing the sensor either (a) by bonding the sensor to the road using an adhesive pad without scouring or mechanically damaging the road surface, or (b) by embedding the sensor in a shallow recess formed in the road surface such that an upper surface of the sensor is coplanar with, or below, the road surface; operating the sensor using a battery housed in the sensor; and recharging the battery, while the sensor remains so installed, using solar energy received by a solar cell carried in an upper portion of the sensor, whereby the sensor is operable over an extended deployment period and is maintainable without digging up and repairing the road surface for maintenance or replacement of the sensor.

16. A system for traffic analysis comprising:
   a. arrays of two or more wireless road-based sensors mounted on, in, or at a surface of a road network, each sensor including a magnetometer;
   b. a receiver configured to receive magnetic field waveform data from information sent by the sensors; and
   c. an analyser configured to analyse the waveform data by computing one or more characteristic values, indices, or signatures derived from the waveform, the analysis comprising at least one of: time-domain analysis, frequency-domain analysis, statistical analysis, or a transformation of the waveform data, and to determine traffic information including vehicle volume or speed, while compensating for malfunctioning or separated sensors.

17. A system as claimed in claim 16, wherein sensors are agnostic of their placement and gateways are agnostic of sensor placement, the system being configured to associate sensors with one or more gateways based on signal strength and to operate with sensor/gateway associations that change over time without manual reconfiguration.

18. A system as claimed in claim 17, wherein the analyser is provided by a system facility that is separate from the sensor gateways and the sensors and the analyser are configured to use combinations of sensor measurements in each array to improve accuracy.

19. A system as claimed in claim 17, wherein the analyser is configured to account for incorrect physical spacing measurements between the sensors in an array.

20. A system as claimed in claim 16, including a notifier for proactively issuing alerts to report the number of sensors that become separated from the road or are otherwise malfunctioning.

21. A system as claimed in claim 16, including a notifier for proactively issuing alerts when an array approaches a single functioning sensor due to sensors having become separated from the road or are otherwise malfunctioning.

22. A system as claimed in claim 16, wherein at least some of the arrays each comprise at least three surface mounted wireless road-based sensors spaced along a corresponding section of road.

23. A system as claimed in claim 16, including an authorization store and authentication protocols that ensure only authorized sensors can associate with specific gateways.

24. A system as claimed in claim 16, wherein the sensors in each array are separated by predetermined distances, which may differ between individual sensor pairs, provided that the actual inter-sensor distances are known or determined for use in the analysis.

25. A system as claimed in claim 16, wherein the analysis generates a compact representation of each event comprising a reference point, a weighted-average index, or a signature vector obtained by applying a mathematical function or transformation to the waveform data, and uses the compact representation for event detection, classification, or sensor association.

26. A system as claimed in claim 16, wherein the sensor includes a sampler to sample changes in magnetic field by activating the magnetometer; the sampler using the sampled magnetic field to control the sampling to:
   (i) provide early warning of nearby vehicular traffic; and
   (ii) increasing magnetic field sampling in response thereto.

27. A system as claimed in claim 16, wherein the wireless road-based sensors are configured for installation on, in, or at a surface of the road network either by bonding to the road using an adhesive pad without scouring or mechanically damaging the road surface, or by embedding in a shallow recess such that an upper surface of each sensor is coplanar with, or below, the road surface; and wherein each sensor is battery-powered and includes a solar cell positioned at an upper portion of the sensor to recharge the battery while the sensor remains installed, the battery powering the magnetometer during deployment.

\*  \*  \*  \*  \*